United States Patent
Lee et al.

(10) Patent No.: US 9,231,216 B2
(45) Date of Patent: Jan. 5, 2016

(54) CARBORANE COMPOUND, ORGANIC LIGHT-EMITTING DIODE INCLUDING THE SAME AND FLAT DISPLAY DEVICE INCLUDING ORGANIC LIGHT-EMITTING DIODE

(75) Inventors: Sun-Hee Lee, Yongin (KR); Dae-Yup Shin, Yongin (KR); Won-Jun Song, Yongin (KR); Kwan-Hee Lee, Yongin (KR); Young-Kyu Do, Daejeong (KR); Min-Hyung Lee, Daejeong (KR); Kang-Mun Lee, Daejeong (KR); Hye-Jin Bae, Daejeong (KR)

(73) Assignees: Samsung Display Co., Ltd., Samsung-ro, Giheung-Gu, Yongin-si, Gyeonggi-Do (KR); KOREA ADVANCED INSTITUTE OF SCIENCE AND TECHNOLOGY, Yuseong-Gu, Daejeong (KR)

(*) Notice: Subject to any disclaimer, the term of this patent is extended or adjusted under 35 U.S.C. 154(b) by 793 days.

(21) Appl. No.: 13/420,804

(22) Filed: Mar. 15, 2012

(65) Prior Publication Data

US 2012/0319088 A1 Dec. 20, 2012

(30) Foreign Application Priority Data

Jun. 20, 2011 (KR) ........................ 10-2011-0059645

(51) Int. Cl.
| | |
|---|---|
| *H01L 51/54* | (2006.01) |
| *C07F 5/02* | (2006.01) |
| *H01L 51/00* | (2006.01) |
| *H01L 51/50* | (2006.01) |

(52) U.S. Cl.
CPC ............ *H01L 51/008* (2013.01); *H01L 51/5012* (2013.01); *H01L 51/5016* (2013.01)

(58) Field of Classification Search
CPC .............. H01L 51/008; H01L 51/5016; H01L 51/5012
See application file for complete search history.

(56) References Cited

U.S. PATENT DOCUMENTS

| | | | |
|---|---|---|---|
| 2008/0224129 A1* | 9/2008 | Choi et al. ...................... | 257/40 |
| 2010/0176386 A1 | 7/2010 | Yersin et al. | |
| 2011/0260146 A1* | 10/2011 | Hamada et al. ................. | 257/40 |
| 2013/0148180 A1* | 6/2013 | Hwang et al. ................... | 359/11 |
| 2013/0148181 A1* | 6/2013 | Hwang et al. ................... | 359/11 |

FOREIGN PATENT DOCUMENTS

| | | | |
|---|---|---|---|
| JP | 2005-166574 A | * | 6/2005 |
| KR | 1020100056448 A | | 5/2010 |

OTHER PUBLICATIONS

Translation for JP 2005-166574 A (publication date Jun. 2005).*
Li et al., Inorganic Chemistry, (2008), vol. 47, pp. 9193-9202.*

(Continued)

*Primary Examiner* — Dawn L Garrett
(74) *Attorney, Agent, or Firm* — Robert E. Bushnell, Esq.

(57) ABSTRACT

A compound represented by Formula 1 below:

$$(R_1)_a\text{—CB—}[Ar]_n\text{—CB—}(R_2)_b \qquad \text{<Formula 1>}$$

wherein CB denotes carborane, Ar is a substituted or unsubstituted phenylene group, and a detailed description of $R_1$, $R_2$, a, b, and n is provided in the detailed description. An organic light-emitting diode including an organic layer including the compound has high luminous efficiency.

20 Claims, 4 Drawing Sheets

(56) References Cited

OTHER PUBLICATIONS

Songkram et al., Inorganic Chemistry, (2010), vol. 49, pp. 11174-11183.*
Barriere et al., Macromolecules, (2009), vol. 42, pp. 2981-2987.*
Tetrahedron Letters, (2006), vol. 47 (12), pp. 1937-1940.*
Kokado et al., Macromolecular Rapid Communications, vol. 31, Issue 15, pp. 1389-1394.*
Bartet et al., Comptes Rendus des Seances de l'Academie des Sciences, Serie B: Sciences Physiques (1974), 279(11), pp. 283-285.*
Multicolor Tuning of Aggregation-Induced Emission through Substituent Variation of Diphenyl-o-carborane by Kenta Kokado and Yoshiki Chujo (Received Oct. 11, 2011), pp. 316-319.
Journal of Organometallic Chemistry; Group 4 ansa-metallocenes derived from o-carborane and their luminescent properties by Chang Hwan Shin et al., date: 2009, pp. 1623-1631.
Ortho-Carborane-Functionalized Luminescent Polyethylene: Potential Chemodosimeter for the Sensing of Nucleophilic Anions by Dr. Myung Hwan Park et al. (Chemistry-An Asian Journal: vol. 6, Issue 6, pages, Jun. 6, 2011), Abstract only provided.
Aromatic ring-Fused Carborane-Based Luminescent TT-Conjugated Polymers by Kenta Kokado et al. (Macromolecular Rapid Communications: vol. 31, Issue 15, pages, Aug. 3, 2010), Abstract only provided.

* cited by examiner

CARBORANE COMPOUND, ORGANIC LIGHT-EMITTING DIODE INCLUDING THE SAME AND FLAT DISPLAY DEVICE INCLUDING ORGANIC LIGHT-EMITTING DIODE

CROSS-REFERENCE TO RELATED PATENT APPLICATION

This application claims the benefit of Korean Patent Application No. 10-2011-0059645, filed on Jun. 20, 2011, in the Korean Intellectual Property Office, the disclosure of which is incorporated herein in its entirety by reference.

BACKGROUND OF THE INVENTION

1. Field of the Invention

The present invention relates to a carborane compound, an organic light-emitting diode including the same, and a flat display device including the organic light-emitting diode.

2. Description of the Related Art

Organic light-emitting diodes (OLEDs), which are self-emitting devices, have advantages such as a wide viewing angle, excellent contrast, quick response, high brightness, and excellent driving voltage characteristics, and can provide multicolored images.

A general OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic layers formed of organic compounds.

An operating principle of an OLED having the above-described structure is as follows. When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

Excitons generated by current excitation are divided into two types: singlet exciton and triplet exciton. The singlet exciton and the triplet exciton are formed at a ratio of 1 to 3 according to spin statistics theorem. In general, singlet excitons contribute to light emission in fluorescent materials, and triplet excitons contribute to light emission in phosphorescent materials. 25% of singlet exciton generation restricts the luminous efficiency of a fluorescent material.

In a case where triplet excitons contribute to luminescence, when a possibility of intersystem crossing (ISC) from a singlet state to a triplet state is high, luminous efficiency may be enhanced. Organometallic compounds including iridium (Ir), platinum (Pt), or the like have relatively high luminous efficiency because intersystem crossing occurs therein by heavy atomic effect.

However, there is a need to develop other materials with high luminous efficiency except for phosphorescent organo-metallic compounds.

SUMMARY OF THE INVENTION

The present invention provides a novel carborane compound with high luminous efficiency, an organic light-emitting diode including an organic layer including the carborane compound, and a flat display device including the organic light-emitting diode. According to an aspect of the present invention, there is provided a carborane compound represented by Formula 1 below:

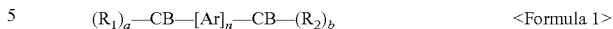

$(R_1)_a$—CB—$[Ar]_n$—CB—$(R_2)_b$     <Formula 1> wherein CB refers to carborane;

each of $R_1$ and $R_2$ is independently one selected from the group consisting of a hydrogen atom, a deuterium atom, a halogen atom, a hydroxyl group, a cyano group, a nitro group, a nitrile group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{30}$ aryl group, a substituted or unsubstituted $C_2$-$C_{30}$ heteroaryl group, a substituted or unsubstituted $C_5$-$C_{30}$ aryloxy group, a substituted or unsubstituted $C_1$-$C_{30}$ acyl group, a substituted or unsubstituted $C_1$-$C_{30}$ amide group, a substituted or unsubstituted $C_2$-$C_{30}$ ester group, a substituted or unsubstituted $C_5$-$C_{30}$ arylthio group, and a group represented by $N(Q_1)(Q_2)$, and each of $Q_1$ and $Q_2$ is independently one selected from the group consisting of a hydrogen atom, a deuterium atom, a halogen atom, a hydroxyl group, a cyano group, an amino group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted pyridinyl group, a substituted or unsubstituted naphthyl group, a substituted or unsubstituted anthryl group, a substituted or unsubstituted fluorenyl group, a substituted or unsubstituted carbazolyl group, and a substituted or unsubstituted pyrimidinyl group;

each of a and b is independently an integer of 1 to 10, a $R_1$ groups are the same as or different from each other and b $R_2$ groups are the same as or different from each other;

Ar is a substituted or unsubstituted phenylene group; and n is an integer of 1 to 10, and, when n is more than 1, the Ar groups are the same as or different from each other.

According to another aspect of the present invention, there is provided an organic light-emitting diode including a first electrode, a second electrode facing the first electrode; and a first layer interposed between the first electrode and the second electrode, wherein the first layer includes the carborane compound described above.

According to another aspect of the present invention, there is provided a flat display device including a transistor including a source, a drain, a gate, and an active layer; and the organic light-emitting diode described above, wherein one of the source and the drain is electrically connected to a first electrode of the organic light-emitting diode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
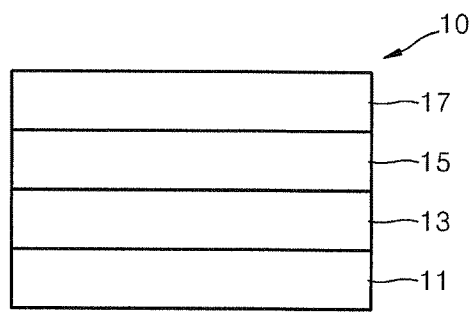
FIG. 1 is a schematic diagram illustrating a structure of an organic light-emitting diode according to an embodiment of the present invention.

The present invention will now be described in detail.

According to an embodiment of the present invention, there is provided a carborane compound represented by Formula 1 below:

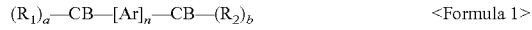
<Formula 1> wherein CB refers to carborane, $R_1$ and $R_2$ are each independently a hydrogen atom, a deuterium atom, a halogen atom, a hydroxyl group, a cyano group, a nitro group, a nitrile group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{30}$ aryl group, a substituted or unsubstituted $C_2$-$C_{30}$ heteroaryl group, a substituted or unsubstituted $C_5$-$C_{30}$ aryloxy group, a substituted or unsubstituted $C_1$-$C_{30}$ acyl group, a substituted or unsubstituted $C_1$-$C_{30}$ amide group, a substituted or unsubstituted $C_2$-$C_{30}$ ester group, a substituted or unsubstituted $C_5$-$C_{30}$ arylthio group, or a group represented by $N(Q_1)(Q_2)$, and $Q_1$ and $Q_2$ are each independently a hydrogen atom, a deuterium atom, a halogen atom, a hydroxyl group, a cyano group, an amino group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted pyridinyl group, a substituted or unsubstituted naphthyl group, a substituted or unsubstituted anthryl group, a substituted or unsubstituted fluorenyl group, a substituted or unsubstituted carbazolyl group or a substituted or unsubstituted pyrimidinyl group, a and b are each independently an integer of 1 to 10, a $R_1$ groups may be the same as or different from each other, and b $R_2$ groups may be the same as or different from each other, Ar is a substituted or unsubstituted phenylene group, n is an integer of 1 to 10, and, when n is more than 1, "Ar"s of $[Ar]_n$ may be the same as or different from each other.

$R_1$ and $R_2$ may be linked to carbon or boron of the carborane. Also, —$[Ar]_n$— may be linked to carbon or boron of the carborane.

A carborane is a cluster composed of boron and carbon atoms, and a carborane cluster is generally in the form of a polyhedron.

The carborane may be, but is not limited to, a closo-carborane that is represented by $C_2B_{10}H_{10}$ and has a closed cage structure. For example, the carborane may be a carborane represented by $C_1B_{11}H_{11}^-$, or a nido-carborane that is represented by $C_2B_9H_{10}^-$ and has an open cage structure.

Also, the carborane may be an ortho-, meta- or para-carborane. In Formula 1, two CBs may be the same as or different from each other.

In particular, $R_1$ and $R_2$ may be each independently a hydrogen atom, a deuterium atom, a halogen atom, a hydroxyl group, a cyano group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted biphenyl group, a substituted or unsubstituted terphenyl group, a substituted or unsubstituted phenoxy group, a substituted or unsubstituted fluorenyl group, a substituted or unsubstituted carbazolyl group, a substituted or unsubstituted naphthyl group, a substituted or unsubstituted phenanthrenyl group, a substituted or unsubstituted pyridinyl group, a substituted or unsubstituted diazinyl group, a substituted or unsubstituted triazinyl group, a substituted or unsubstituted quinolinyl group, a substituted or unsubstituted benzimidazolyl group, a substituted or unsubstituted benzoxazolyl group, a substituted or unsubstituted pentalenyl group, a substituted or unsubstituted indenyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted spiro-fluorenyl group, a substituted or unsubstituted phenalenyl group, a substituted or unsubstituted phenanthridinyl group, a substituted or unsubstituted phenanthrolinyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted imidazopyridinyl group, a substituted or unsubstituted pyrazinyl group, a substituted or unsubstituted pyrimidinyl group, a substituted or unsubstituted imidazopyrimidinyl group, a substituted or unsubstituted pyridazinyl group, a substituted or unsubstituted indolyl group, a substituted or unsubstituted isoindolyl group, a substituted or unsubstituted pyridoindolyl group, a substituted or unsubstituted indazolyl group, a substituted or unsubstituted purinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted phenazinyl group, a substituted or unsubstituted furanyl group, a substituted or unsubstituted benzofuranyl group, a substituted or unsubstituted dibenzofuranyl group, a substituted or unsubstituted thiophenyl group, a substituted or unsubstituted benzothiophenyl group, a substituted or unsubstituted dibenzothiophenyl group, a substituted or unsubstituted thiazolyl group, a substituted or unsubstituted isothiazolyl group, a substituted or unsubstituted benzothiazolyl group, a substituted or unsubstituted oxazolyl group, a substituted or unsubstituted isoxazolyl group, a substituted or unsubstituted oxadiazolyl group, a substituted or unsubstituted triazolyl group, a substituted or unsubstituted tetrazolyl group, or a group represented by $N(Q_1)(Q_2)$, and $Q_1$ and $Q_2$ may be each independently a hydrogen atom, a deuterium atom, a halogen atom, a hydroxyl group, a cyano group, an amino group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted pyridinyl group, a substituted or unsubstituted naphthyl group, a substituted or unsubstituted anthryl group, a substituted or unsubstituted fluorenyl group, a substituted or unsubstituted carbazolyl group, or a substituted or unsubstituted pyrimidinyl group.

In Formula 1, [Ar] may be, but is not limited to, a group represented by Formula 2:

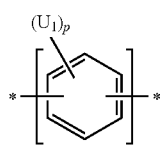

<Formula 2> wherein $U_1$ may be a hydrogen atom, a deuterium atom, a halogen atom, a hydroxyl group, a cyano group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted biphenyl group, a substituted or unsubstituted terphenyl group, a substituted or unsubstituted phenoxy group, a substituted or unsubstituted fluorenyl group, a substituted or unsubstituted carbazolyl group, a substituted or unsubstituted naphthyl group, a substituted or unsubstituted phenanthrenyl group, a substituted or unsubstituted pyridinyl group, a substituted or unsubstituted diazinyl group, a substituted or unsubstituted triazinyl group, a substituted or unsubstituted quinolinyl group, a substituted or unsubstituted benzimidazolyl group, a substituted or unsubstituted benzoxazolyl group, a substituted or unsubstituted pentalenyl group, a substituted or unsubstituted indenyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted spiro-fluorenyl group, a substituted or unsubstituted phenalenyl group, a substituted or unsubstituted phenanthridinyl group, a substituted or unsubstituted phenanthrolinyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted imidazopyridinyl group, a substituted or unsubstituted pyrazinyl group, a substituted or unsubstituted pyrimidinyl group, a substituted or unsubstituted imidazopyrimidinyl group, a substituted or unsubstituted pyridazinyl group, a substituted or unsubstituted indolyl group, a substituted or unsubstituted isoindolyl group, a substituted or unsubstituted pyridoindolyl group, a substituted or unsubstituted indazolyl group, a substituted or unsubstituted purinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted phenazinyl group, a substituted or unsubstituted furanyl group, a substituted or unsubstituted benzofuranyl group, a substituted or unsubstituted dibenzofuranyl group, a substituted or unsubstituted thiophenyl group, a substituted or unsubstituted benzothiophenyl group, a substituted or unsubstituted dibenzothiophenyl group, a substituted or unsubstituted thiazolyl group, a substituted or unsubstituted isothiazolyl group, a substituted or unsubstituted benzothiazolyl group, a substituted or unsubstituted oxazolyl group, a substituted or unsubstituted isoxazolyl group, a substituted or unsubstituted oxadiazolyl group, a substituted or unsubstituted triazolyl group, a substituted or unsubstituted tetrazolyl group, or a group represented by $N(Q_1)(Q_2)$, and $Q_1$ and $Q_2$ may be each independently a hydrogen atom, a deuterium atom, a halogen atom, a hydroxyl group, a cyano group, an amino group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted pyridinyl group, a substituted or unsubstituted naphthyl group, a substituted or unsubstituted anthryl group, a substituted or unsubstituted fluorenyl group, a substituted or unsubstituted carbazolyl group or a substituted or unsubstituted pyrimidinyl group, p is an integer of 1 to 4, and, when p is more than 1, "$U_1$"s of $(U_1)_p$ may be the same as or different from each other.

Thus, Ar may be a substituted or unsubstituted phenylene group in a case of —[Ar]$_n$— where n=1, Ar may be a substituted or unsubstituted biphenylene group in a case of —[Ar]$_n$— where n=2, Ar may be a substituted or unsubstituted terphenylene group in a case of —[Ar]$_n$— where n=3, Ar may be a substituted or unsubstituted tetraphenylene group in a case of —[Ar]$_n$— where n=4, Ar may be a substituted or unsubstituted pentaphenylene group in a case of —[Ar]$_n$— where n=5, Ar may be a substituted or unsubstituted hexaphenylene group in a case of —[Ar]$_n$— where n=6, Ar may be a substituted or unsubstituted heptaphenylene group in a case of —[Ar]$_n$— where n=7, Ar may be a substituted or unsubstituted octaphenylene group in a case of —[Ar]$_n$— where n=8, Ar may be a substituted or unsubstituted nonaphenylene group in a case of —[Ar]$_n$— where n=9, and Ar may be a substituted or unsubstituted decaphenylene group in a case of —[Ar]$_n$— where n=10.

Meanwhile, —[Ar]$_n$— where n=3 may be represented by Formula 3a, 3b or 3c below:

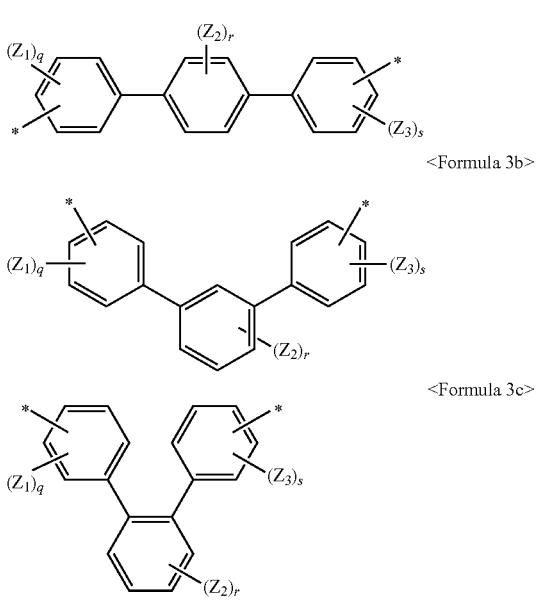

<Formula 3a>
<Formula 3b>
<Formula 3c> wherein $Z_1$, $Z_2$ and $Z_3$ may be each independently a hydrogen atom, a deuterium atom, a halogen atom, a hydroxyl group, a cyano group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted biphenyl group, a substituted or unsubstituted terphenyl group, a substituted or unsubstituted phenoxy group, a substituted or unsubstituted fluorenyl group, a substituted or unsubstituted carbazolyl group, a substituted or unsubstituted naphthyl group, a substituted or unsubstituted phenanthrenyl group, a substituted or unsubstituted pyridinyl group, a substituted or unsubstituted diazinyl group, a substituted or unsubstituted triazinyl group, a substituted or unsubstituted quinolinyl group, a substituted or unsubstituted benzimidazolyl group, a substituted or unsubstituted benzoxazolyl group, a substituted or unsubstituted pentalenyl group, a substituted or unsubstituted indenyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted spiro-fluorenyl group, a substituted or unsubstituted phenalenyl group, a substituted or unsubstituted phenanthridinyl group, a substituted or unsubstituted phenanthrolinyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted imidazopyridinyl group, a substituted or unsubstituted pyrazinyl group, a substituted or unsubstituted pyrimidinyl group, a substituted or unsubstituted imidazopyrimidinyl group, a substituted or unsubstituted pyridazinyl group, a substituted or unsubstituted indolyl group, a substituted or unsubstituted isoindolyl group, a substituted or unsubstituted pyridoindolyl group, a substituted or unsubstituted indazolyl group, a substituted or unsubstituted purinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted phenazinyl group, a substituted or unsubstituted furanyl group, a substituted or unsubstituted benzofuranyl group, a substituted or unsubstituted dibenzofuranyl group, a substituted or unsubstituted thiophenyl group, a substituted or unsubstituted benzothiophenyl group, a substituted or unsubstituted dibenzothiophenyl group, a substituted or unsubstituted thiazolyl group, a substituted or unsubstituted isothiazolyl group, a substituted or unsubstituted benzothiazolyl group, a substituted or unsubstituted oxazolyl group, a substituted or unsubstituted isoxazolyl group, a substituted or unsubstituted oxadiazolyl group, a substituted or unsubstituted triazolyl group, a substituted or unsubstituted tetrazolyl group, or a group represented by $N(Q_1)(Q_2)$; $Q_1$ and $Q_2$ may be each independently a hydrogen atom, a deuterium atom, a halogen atom, a hydroxyl group, a cyano group, an amino group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted pyridinyl group, a substituted or unsubstituted naphthyl group, a substituted or unsubstituted anthryl group, a substituted or unsubstituted fluorenyl group, a substituted or unsubstituted carbazolyl group or a substituted or unsubstituted pyrimidinyl group;

A plurality of $Z_1$, $Z_2$ and $Z_3$ may be each independently the same as or different from each other; and q, r and s are each independently an integer of 1 to 4, and * indicates a binding site.

In —[Ar]$_n$— where n is 4 or greater, a plurality of —Ar— groups may be linked to each other in a para position; however, it is not limited thereto. For example, the plurality of —Ar— groups may be linked to each other in an ortho or meta position, or in a combination of ortho, meta and para positions.

The carborane of Formula 1 may be, but is not limited to, one of the compounds represented by Formulae 4a through 4c below;

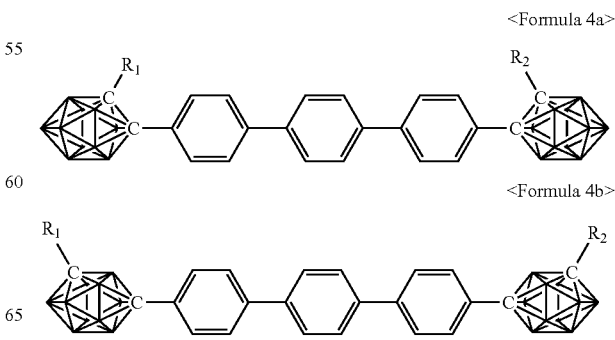

<Formula 4a>
<Formula 4b>

<Formula 4c>

In Formulae 4a through 4c above, vertexes at which element symbols are not represented may each independently indicate B—H.

In Formulae 4a through 4c above, a detailed description of $R_1$ and $R_2$ has already been provided above.

In the carborane compound described above, a carborane substituent is introduced into a luminophore, thereby stabilizing an excited state of molecules. Accordingly, intersystem crossing is rapidly induced to enhance phosphorescence. In other words, the carborane compound has a small gap (about 0.05 eV to about 0.15 eV) between energy levels of a triplet state and a singlet state, and thus intersystem crossing may rapidly occur, resulting in enhanced luminous efficiency. In this regard, the carborane compound may emit light at the enhanced luminous efficiency at room temperature.

The carborane compound may have a phosphorescence lifetime in the range of about 0.1 μs to 50 μs, for example, in the range of 1 μs to about 10 μs.

The carborane compound does not include a transition metal having a large atomic number and may have as high as phosphorescent luminous efficiency at room temperature of a general organometallic compound which emits phosphorescence, and thus may be used to form an emissive layer of an organic light-emitting diode. The carborane compound may be used as a dopant in the emissive layer composed of a host and a dopant, and may also be used as a host in the emissive layer. In addition, carborane acts as electron withdrawing, and thus the carborane compound is expected to be able to be used to form an electron transport layer or a hole blocking layer.

The term "substituted A" in "substituted or unsubstituted A (A is a certain substituent)" used herein indicates that at least one hydrogen atom of A is substituted with a substituent selected from the group consisting of a deuterium atom, a halogen atom, a hydroxyl group, a cyano group, a nitro group, an amino group, hydrazine, hydrazone, a carboxyl group or a salt derivative thereof, a sulfonic acid group or a salt derivative thereof, a phosphoric acid group or a salt derivative thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_3$-$C_{30}$ cycloalkyl group, a $C_3$-$C_{30}$ cycloalkenyl group, a $C_5$-$C_{30}$ aryl group, a $C_5$-$C_{30}$ aryloxy group, a $C_5$-$C_{30}$ arylthio group, a $C_3$-$C_{30}$ heteroaryl group, a group represented by N($Q_{101}$)($Q_{102}$), and a group represented by Si($Q_{103}$)($Q_{104}$)($Q_{105}$). In this regard, $Q_{101}$ through $Q_{105}$ may be each independently a hydrogen atom, a deuterium atom, a halogen atom, a hydroxyl group, a cyano group, an amino group, a nitro group, a carboxyl group, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_3$-$C_{30}$ cycloalkyl group, a $C_3$-$C_{30}$ cycloalkenyl group, a $C_5$-$C_{30}$ aryl group, a $C_5$-$C_{30}$ aryloxy group, a $C_5$-$C_{30}$ arylthio group, or a $C_3$-$C_{30}$ heteroaryl group.

For example, the term "substituted A" used herein indicates that at least one hydrogen atom of A is substituted with one selected from the group consisting of a deuterium atom, a halogen atom, a hydroxyl group, a cyano group, a nitro group, a carboxyl group, a methyl group, an ethyl group, a propyl group, a butyl group, a pentyl group, a methoxy group, an ethoxy group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, a phenanthridinyl group, a phenanthrolinyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a benzoimidazolyl group, a pyrazolyl group, a pyridinyl group, a pyrazinyl group, a pyrimidinyl group, an imidapyrimidinyl group, a pyridazinyl group, an indolyl group, an isoindolyl group, a pyridoindolyl group, an indazolyl group, a purinyl group, a quinolinyl group, a benzoquinolinyl group, a phthalazinyl group, a naphthyridinyl group, a quinoxalinyl group, a quinazolinyl group, a carbazolyl group, a phenazinyl group, a furanyl group, a benzofuranyl group, a dibenzofuranyl group, a thiophenyl group, a benzothiophenyl group, a dibenzothiophenyl group, a thiazolyl group, an isothiazolyl group, a benzothiazolyl group, an oxazolyl group, a benzoxazolyl group, an isoxazolyl group, an oxadiazolyl group, a triazolyl group, a triazinyl group, a tetrazolyl group, a group represented by N($Q_{101}$)($Q_{102}$), and a group represented by Si($Q_{103}$)($Q_{104}$)($Q_{105}$).

The unsubstituted $C_1$-$C_{30}$ alkyl group denotes a saturated hydrocarbon group having a linear and branched structure in which one hydrogen atom is lacking in alkane. Examples of the unsubstituted $C_1$-$C_{30}$ alkyl group may include methyl, ethyl, propyl, isobutyl, sec-butyl, pentyl, iso-amyl, hexyl, and the like. A detailed description of a substituent of the substituted $C_1$-$C_{30}$ alkyl group is already provided in the description for the "substituted A."

The unsubstituted $C_2$-$C_{30}$ alkenyl group denotes a terminal group containing at least one carbon double bond at the middle or the end of the unsubstituted $C_2$-$C_{30}$ alkyl group. Examples of the unsubstituted $C_2$-$C_{30}$ alkenyl group may include ethenyl, propenyl, butenyl, pentenyl, hexenyl, heptenyl, octenyl, propadienyl, isoprenyl, allyl, and the like. A detailed description of a substituent of the substituted $C_2$-$C_{30}$ alkenyl group is already provided in the description for the "substituted A."

The unsubstituted $C_2$-$C_{30}$ alkynyl group denotes a terminal group containing at least one carbon triple bond at the middle or the end of the unsubstituted. $C_2$-$C_{60}$ alkyl group. The unsubstituted $C_2$-$C_{30}$ alkynyl group may be acetylenyl. A detailed description of a substituent of the substituted $C_2$-$C_{30}$ alkynyl group is already provided in the description for the "substituted A."

The unsubstituted $C_1$-$C_{30}$ alkoxy group has Formula of —OY (Y is the unsubstituted $C_1$-$C_{30}$ alkyl group) and may be, for example, methoxy, ethoxy, isopropyloxy, butoxy, pentoxy, and the like. A detailed description of a substituent of the substituted $C_1$-$C_{30}$ alkoxy group is already provided in the description for the "substituted A."

The unsubstituted $C_3$-$C_{30}$ cycloalkyl group denotes a ring-type saturated hydrocarbon group and may be, for example, cyclopropyl, cyclobutyl, cyclopentyl, cyclohexyl, cyclooctyl, and the like. A detailed description of a substituent of the substituted $C_3$-$C_{30}$ cycloalkyl group is already provided in the description for the "substituted A."

The unsubstituted $C_3$-$C_{30}$ cycloalkenyl group denotes a ring-type unsaturated hydrocarbon group which has at least one carbon double bond and is not an aromatic ring. Examples of the unsubstituted $C_3$-$C_{30}$ cycloalkenyl group may include cyclopropenyl, cyclobutenyl, cyclopentenyl, cyclohexenyl, cycloheptenyl, a 1,3-cyclohexadienyl group, a 1,4-cyclohexadienyl group, a 2,4-cycloheptadienyl group, a 1,5-cyclooctadienyl group, and the like. A detailed description of a substituent of the substituted $C_3$-$C_{60}$ cycloalkenyl group is already provided in the description for the "substituted A."

The unsubstituted $C_5$-$C_{30}$ aryl group denotes a monovalent group having a $C_5$-$C_{30}$ carbocyclic aromatic system, wherein the monovalent group may be a monocyclic or polycyclic group. In the polycyclic group, at least two rings included therein may be fused with each other. Examples of the unsubstituted $C_5$-$C_{30}$ aryl group may include phenyl, pentalenyl, indenyl, naphthyl, azulenyl, heptalenyl, indacenyl, acenaphthyl, fluorenyl, spiro-fluorenyl, phenalenyl, phenanthrenyl, anthryl, fluoranthenyl, triphenylenyl, pyrenyl, chrysenyl, naphthacenyl, picenyl, perylenyl, pentaphenyl, hexacenyl, and the like. A detailed description of a substituent of the substituted $C_5$-$C_{30}$ aryl group is already provided in the description for the "substituted A."

The unsubstituted $C_5$-$C_{30}$ aryloxy group denotes a monovalent group, to which carbon atoms of the $C_5$-$C_{30}$ aryl group are attached through an oxygen linking group (—O—). A detailed description of a substituent of the substituted $C_5$-$C_{30}$ aryloxy group is already provided in the description for the "substituted A."

The unsubstituted $C_5$-$C_{30}$ arylthio group denotes a monovalent group, to which carbon atoms of the $C_5$-$C_{30}$ aryl group are attached through a sulfur linking group (—S—). Examples of the unsubstituted $C_5$-$C_{30}$ arylthio group may include phenylthio, naphthylthio, indanylthio, and indenylthio. A detailed description of a substituent of the substituted $C_5$-$C_{30}$ arylthio group is already provided in the description for the "substituted A."

The unsubstituted $C_3$-$C_{30}$ heteroaryl group denotes a monovalent group including at least one ring containing at least one heteroatom selected from the group consisting of N, O, P, and S, wherein the monovalent group is monocyclic or polycyclic. In the polycyclic group, at least two rings included therein may be fused with each other. Examples of the unsubstituted $C_3$-$C_{30}$ heteroaryl group may include pyrrolyl, imidazolyl, pyrazolyl, pyridinyl, pyrazinyl, pyrimidinyl, pyridazinyl, isoindolyl, indolyl, indazolyl, purinyl, quinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzoxazolyl, benzoimidazolyl, furanyl, benzofuranyl, thiophenyl, benzothiophenyl, thiazolyl, isothiazolyl, benzothiazolyl, isoxazolyl, oxazolyl, triazolyl, tetrazole, oxadiazolyl, triazinyl, benzoxazolyl, and the like. A detailed description of a substituent of the substituted $C_3$-$C_{30}$ heteroaryl group is already provided in the description for the "substituted A."

The unsubstituted $C_1$-$C_{30}$ alkylene group denotes a divalent group having a linear and branched structure, in which two hydrogen atoms are lacking in alkane. Examples of the unsubstituted $C_1$-$C_{30}$ alkylene group are already provided in the description with regards to the unsubstituted $C_1$-$C_{30}$ alkyl group. A detailed description of a substituent of the substituted $C_1$-$C_{30}$ alkylene group is already provided in the description for the "substituted A."

The unsubstituted $C_5$-$C_{30}$ arylene group may denote a divalent group having a $C_5$-$C_{30}$ carbocyclic aromatic system, wherein the divalent group may be a monocyclic or polycyclic group. Examples of the unsubstituted $C_5$-$C_{30}$ arylene group are already provided in the description with regards to the unsubstituted $C_5$-$C_{30}$ aryl group. A detailed description of a substituent of the substituted $C_5$-$C_{30}$ arylene group is already provided in the description for the "substituted A."

A method of synthesizing the carborane compound may easily be understood by one of ordinary skill in the art with reference to the following Examples, which will be described later.

The carborane compound of Formula 1 may be used in an organic light-emitting diode.

According to another embodiment of the present invention, there is provided an organic light-emitting diode including a first electrode, a second electrode facing the first electrode, and a first layer interposed between the first electrode and the second electrode, wherein the first layer includes the carborane compound of Formula 1 as described above.

The first layer may be at least one selected from the group consisting of a hole transport layer (HTL), a hole injection layer (HIL), a functional layer having a hole injection ability and a hole transporting ability, an emission layer (EML), an electron transport layer (ETL), an electron injection layer (EIL), and a functional layer having an electron injection ability and an electron transporting ability. The first layer is not limited to the above examples, and may be well-known various layers according to a desired structure of an organic light-emitting diode.

The organic light-emitting diode may further include, between the first electrode and the second electrode, a HIL, a HTL, a functional layer having a hole injection ability and a hole transporting ability, an electron blocking layer (EBL), an EML, a hole blocking layer (HBL), an EIL, an ETL, a functional layer having an electron injection ability and an electron transporting ability, or a combination of at least two of these layers different from the first layer described above. For example, the organic light-emitting diode may have a first electrode/HIL/HTL/first layer including the carborane compound of Formula 1 (that is, acts as an emission layer)/ETL/EIL/second electrode structure; however, the present invention is not limited thereto.

At least one of the layers interposed between the first electrode and the second electrode of the organic light-emitting diode may be formed by deposition or using a wet process.

The term "wet process" used herein refers to a process for applying a mixture obtained by mixing a certain material and a certain solvent on a certain substrate, drying and/or heat treating the substrate so as to remove part of the solvent, and thereby forming a film including the material on the substrate.

For example, the first layer may be formed using a general vacuum deposition method. Alternatively, a mixture of the carborane compound and a solvent is provided to a region for forming a first layer by spin coating, spraying, inkjet printing, dipping, casting, gravure coating, bar coating, roll coating, wirebar coating, screen coating, flexo coating, offset coating, or laser transferring, and the mixture provided to the region for forming a first mixing layer is then dried and/or heat treated so as to remove part of the solvent, thereby forming the first layer.

Alternatively, a first layer may be formed on a base film by vacuum deposition or a wet process as described above, and the first layer may be transferred to a region (for example, on a HTL) for forming a first layer by laser transferring.

When the first layer is an emission layer, the first layer may include the carborane compound of Formula 1 only or with other compounds.

For example, the first layer may be an EML, and the carborane compound included in the first layer may be used as a phosphorescent dopant. In this regard, an energy gap between a singlet excited state ($S_1$) and a triplet excited state ($T_2$) of the carborane compound is small, and thus intersystem crossing between the two states is accelerated and an energy transfer from the triplet excited state ($T_2$) to a triplet excited state ($T_1$) occurs, resulting in phosphorescence emission ($T_1 \rightarrow S_0$).

The first layer may further include a fluorescent host or a phosphorescent host. In particular, the first layer may be an EML including the carborane compound acting as a phosphorescent dopant and a phosphorescent or fluorescent host.

Also, the first layer may be an EML including the carborane compound acting as a fluorescent dopant and a phosphorescent or fluorescent host. The first layer may further include other phosphorescent dopants.

The first layer may be an EML, and the carborane compound included in the first layer may be used as a fluorescent host or a phosphorescent host. The first layer may further include a fluorescent dopant or a phosphorescent dopant. In particular, the first layer may be an EML including the carborane compound acting as a phosphorescent host and a phosphorescent dopant, or an EML including the carborane compound acting as a fluorescent host and a fluorescent dopant.

Meanwhile, the EML of the organic light-emitting diode may further include at least one of an anthracene-based compound, an arylamine-based compound, and a styryl-based compound.

Also, the first layer may be an ETL, and the ETL may include the carborane compound or the carborane compound and a metal-containing material. In this regard, the metal-containing material may include a Li complex. The first layer may also be a HTL, and the HTL may include the carborane compound. In other words, the carborane compound may be included in a HTL, a HIL, a functional layer having a hole injection ability and a hole transporting ability, an EML, an ETL, an EIL, and a functional layer having an electron injection ability and an electron transporting ability.

Hereinafter, a structure and a manufacturing method of an organic light-emitting diode will be described in more detail with reference to FIG. 1. FIG. 1 is a schematic diagram illustrating a structure of an organic light-emitting diode 10 according to an embodiment of the present invention.

Referring to FIG. 1, the organic light-emitting diode 10 includes a substrate 11, a first electrode 13, an organic layer 15, and a second electrode 17 that are sequentially formed.

The substrate 11 may be a substrate used in a general organic light-emitting diode, and may be a glass substrate or a transparent plastic substrate having excellent mechanical strength, thermal stability, transparency, surface smoothness, ease of handling, and waterproofness.

The first electrode 13 may be formed by applying a first electrode material on the substrate 11 by deposition or sputtering. When the first electrode 13 is an anode, the first electrode material may be selected from materials having a high work function so as to facilitate hole injection. The first electrode 13 may be a reflective electrode or a transparent electrode. Examples of the first electrode material may include indium-tin oxide (ITO), Indium-zinc-oxide (IZO), tin oxide ($SnO_2$), and zinc oxide (ZnO). Also, when magnesium (Mg), aluminum (Al), aluminum-lithium (Al—Li), calcium (Ca), magnesium-indium (Mg—In), or magnesium-silver (Mg—Ag) is used as the first electrode material, the first electrode 13 may be formed as a reflective electrode.

The organic layer 15 is formed on the first electrode 13. The term "organic layer" used herein refers to all the layers interposed between the first electrode 13 and the second electrode 17. The organic layer 15 may not necessarily be formed of only an organic compound, and also include a metal complex.

The organic layer 15 includes a first layer including the carborane compound represented by Formula 1, and may further include at least one selected from the group consisting of a HIL, a HTL, a functional layer having a hole injection ability and a hole transporting ability, an EML, a HBL, an ETL, an EIL, and a functional layer having an electron injection ability and an electron transporting ability. For example, when the first layer is an ETL, the organic layer 15 may further include a HIL, a HTL, an EML, and an EIL, in addition to the first layer functioning as the ETL; however, the present invention is not limited thereto.

The HIL may be formed on the first electrode 13 by using various methods such as vacuum deposition, spin coating, casting, or LB deposition.

When the HIL is formed by vacuum deposition, the deposition conditions may vary according to a compound used as a material for forming the HIL, a structure of a desired HIL, and thermal characteristics. For example, the deposition condition may be, but is not limited to, a deposition temperature of about 100 to about 500° C., a degree of vacuum of about $10^{-8}$ to about $10^{-3}$ torr, and a deposition speed of about 0.01 to about 100 Å/sec.

When the HIL is formed by spin coating as a wet process, the deposition condition may vary according to a compound used as a material for forming the HIL, a structure of a desired HIL, and thermal characteristics. For example, the deposition condition may be, but is not limited to, a coating speed of about 2,000 rpm to about 5,000 rpm and a heat treatment temperature for removing a solvent after coating of about 80 to about 200° C.

The material for forming the HIL may be at least one of the carborane compound of Formula 1 and a known hole injection material. Examples of the known hole injection material include, but are limited to, N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), 4,4',4"-tris(N,N-diphenylamino)triphenylamine (TDATA), 4,4',4"-tris{N,-(2-naphthyl)-N-phenylamino}-triphenylamine (2T-NATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), and polyaniline/poly(4-styrenesulfonate) (PANI/PSS).

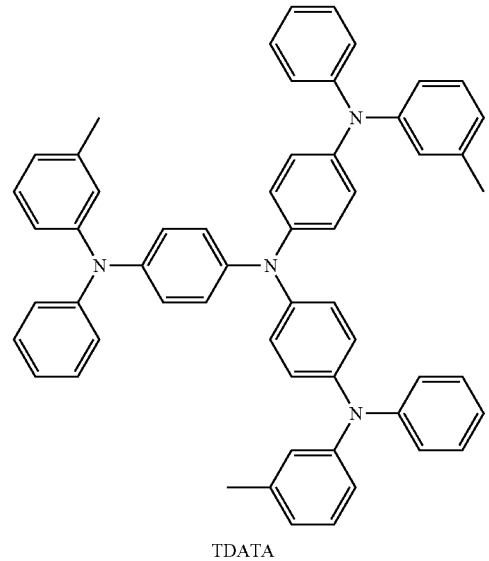

TDATA

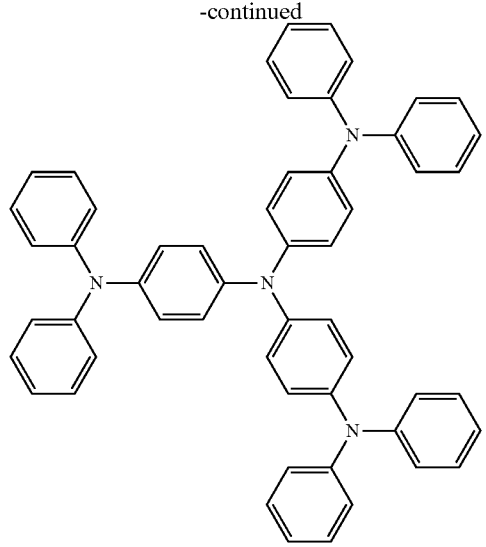

m-MTDATA

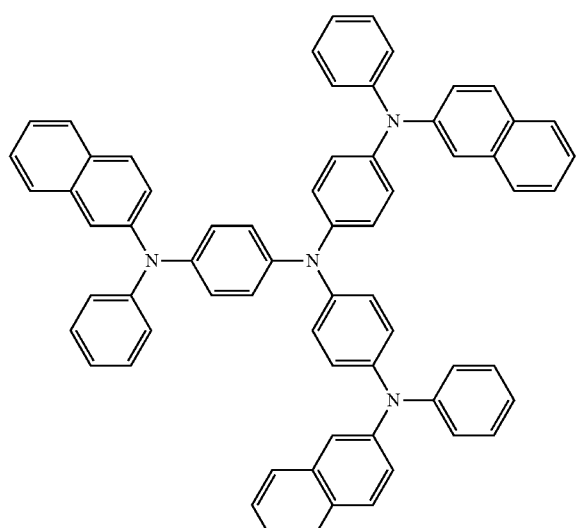

2T-NATA

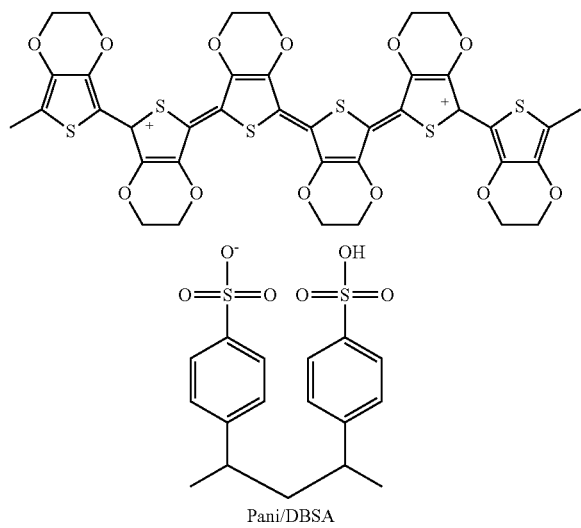

Pani/DBSA

PEDOT/PSS

The thickness of the HIL may be in the range of about 100 Å to about 10,000 Å, for example, in the range of about 100 Å to about 1,000 Å. When the thickness of the HIL is within this range, satisfactory hole injection properties may be obtained without a substantial increase in driving voltage.

Next, the HTL may be formed on the HIL by using various methods such as vacuum deposition, spin coating, casting, or LB deposition. When the HTL is formed by vacuum deposition or spin coating, the deposition and coating conditions vary according to a used compound. However, in general, the condition may be almost the same as the condition for forming the HIL.

A material for forming the HTL may be at least one of the carborane compound of Formula 1 and a known hole transporting material. Examples of the known hole transporting material include carbazole derivatives such as N-phenylcarbazole and polyvinylcarbazole, amine derivatives having aromatic condensed rings such as N,N'-bis(3-methylphenyl)-N,N'-diphenyl-[1,1-biphenyl]-4,4'-diamine (TPD) and 4,4'-bis[N-(1-naphthyl)-N-phenylamino]biphenyl (α-NPB), and triphenylamine-based materials such as 4,4',4"-tris(N-carbazolyl)triphenylamine (TCTA).

TPD

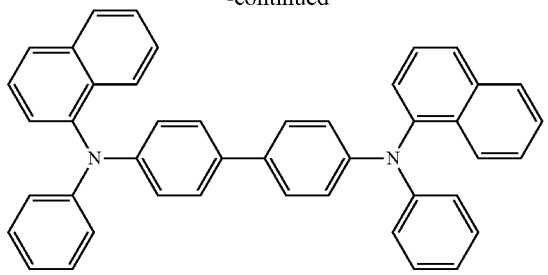

α-NPB

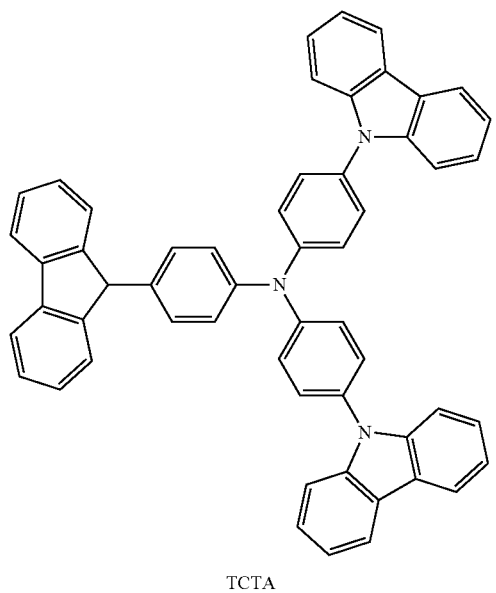

TCTA

The thickness of the HTL may be in the range of about 50 Å to about 1,000 Å, for example, in the range of about 100 Å to about 800 Å. When the thickness of the HTL is within this range, satisfactory hole transport properties may be obtained without a substantial increase in driving voltage.

In addition, the functional layer having a hole injection ability and a hole transporting ability may be formed instead of the HIL and the HTL. A material for forming the functional layer may be selected from known materials, and may further include the carborane compound of Formula 1.

At least one of the HIL, the HTL, and the functional layer having a hole injection ability and a hole transporting ability may further include a charge-generating material so as to increase the conductivity of the layers, in addition to the carborane compound of Formula 1 described above, the known hole injection material, the known hole transporting material, and a known material for forming the functional layer having a hole injection ability and a hole transporting ability.

The charge-generating material may be, for example, a p-dopant. Examples of the p-dopant may include, but are not limited to, quinone derivatives such as tetra-cyanoquinodimethane (TCNQ) and 2,3,5,6-tetrafluoro-tetracyano-1,4-benzoquinodimethane (F4TCNQ); metal oxides such as an tungsten oxide and a molybdenum oxide; and cyano-containing compounds such as Compound 100 and the like.

<Compound 100>

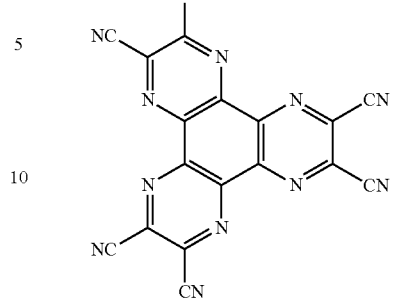

When the HIL, the HTL or the functional layer having a hole injection ability and a hole transporting ability further includes the charge-generating material, the charge-generating material may be homogeneously or inhomogeneously dispersed in these layers.

The EML may be formed on the HTL or the functional layer having a hole injection ability and a hole transporting ability by vacuum deposition, spin coating, casting, or LB deposition. When the EML is formed by vacuum deposition or spin coating, the deposition and coating conditions vary according to a used compound. However, in general, the condition may be almost the same as the condition for forming the HIL.

A material for forming the EML may be at least one of the carborane compound of Formula 1 and a known luminescent material (including both a host and a dopant). When the EML includes the carborane compound of Formula 1, the EML may further include a known phosphorescent host, a known fluorescent host, a known phosphorescent dopant, or a know fluorescent dopant. The carborane compound of Formula 1 may act as a phosphorescent dopant, a fluorescent dopant, a phosphorescent host, or a fluorescent host.

Examples of the known host may include, but are not limited to, $Alq_3$, 4,4'-N,N'-dicarbazole-biphenyl (CBP), poly (n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl) anthracene (TBADN), distyrylarylene (DSA), and E3.

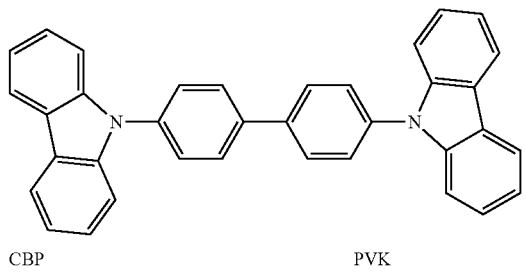

CBP                                PVK

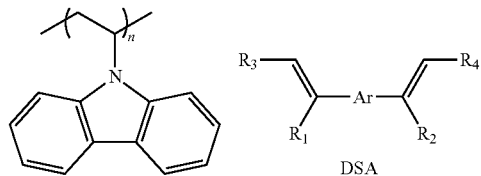

DSA

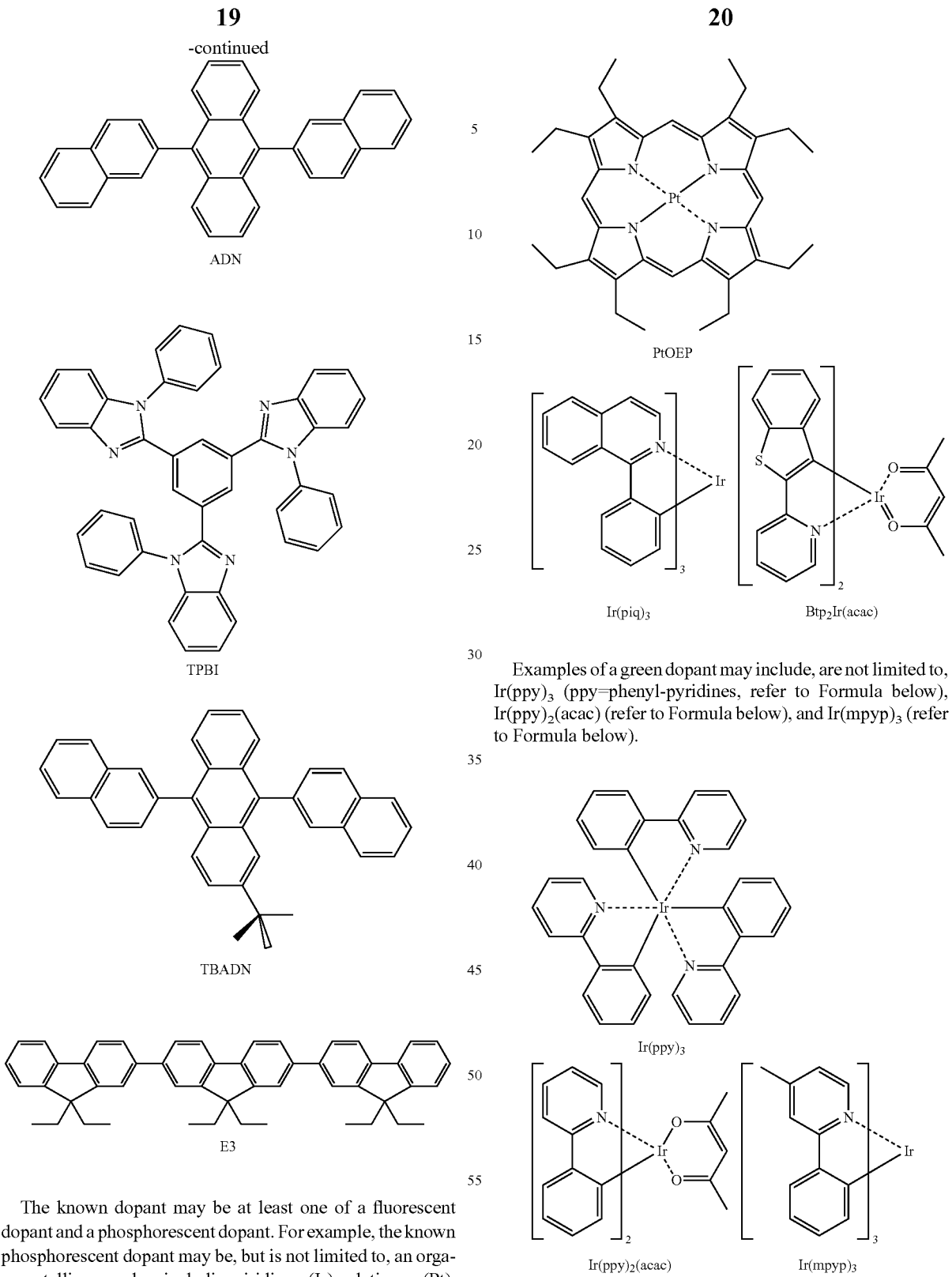

The known dopant may be at least one of a fluorescent dopant and a phosphorescent dopant. For example, the known phosphorescent dopant may be, but is not limited to, an organometallic complex including iridium (Ir), platinum (Pt), osmium (Os), rhenium (Re), titanium (Ti), zirconium (Zr), hafnium (Hf), or a combination of at least two of these elements.

Examples of a red dopant may include, are not limited to, PtOEP (refer to Formula below), Ir(piq)$_3$ (refer to Formula below), and Btp$_2$Ir(acac) (refer to Formula below).

Examples of a green dopant may include, are not limited to, Ir(ppy)$_3$ (ppy=phenyl-pyridines, refer to Formula below), Ir(ppy)$_2$(acac) (refer to Formula below), and Ir(mpyp)$_3$ (refer to Formula below).

Examples of a blue dopant may include, are not limited to, F$_2$Irpic (refer to Formula below), (F$_2$ ppy)$_2$Ir(tmd) (refer to Formula below), Ir(dfppz)$_3$ (refer to Formula below), DPVBi (refer to Formula below), 4,4'-bis(4-diphenylaminosteril)biphenyl (DPAVBi) (refer to Formula below), and 2,5,8,11-tetra-tert-butylphenylene (TBPe) (refer to Formula below.

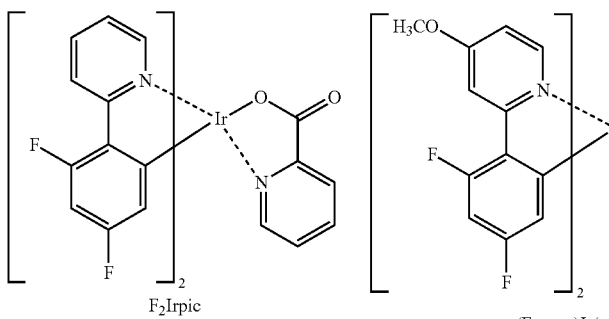

F₂Irpic (F₂ppy₂)Ir(tmd)

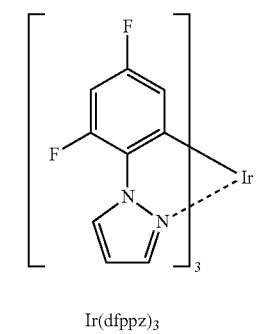

Ir(dfppz)₃

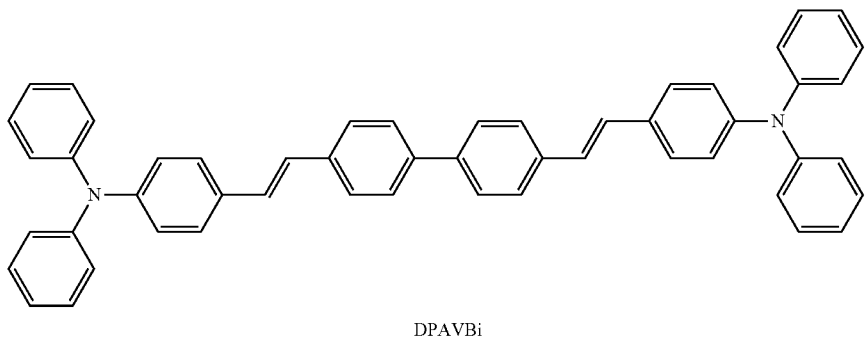

DPAVBi

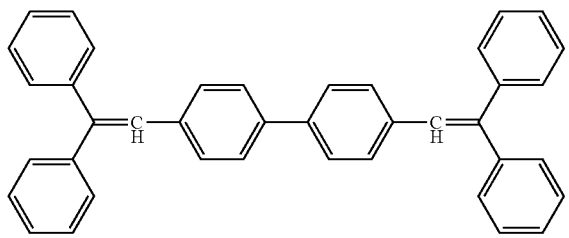

DPVB

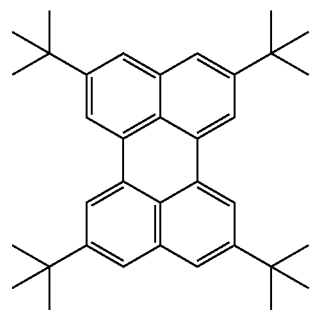

TBPe

When the emission layer includes a host and a dopant, the amount of the dopant may be generally in the range of about 0.01 to about 15 parts by weight based on 100 parts by weight of the host; however, it is not limited thereto.

The thickness of the emission layer may be in the range of about 100 Å to about 1,000 Å, for example, in the range of about 200 Å to about 600 Å. When the thickness of the emission layer is within this range, excellent luminescent properties may be obtained without a substantial increase in driving voltage.

When the phosphorescent dopant is included in the emission layer, a HBL may be formed between the ETL and the EML by vacuum deposition, spin coating, casting or LB deposition so as to prevent triplet excitons or holes from being diffused to the ETL. When the HBL is formed by vacuum deposition or spin coating, the conditions thereof may vary according to a used compound. However, in general, the conditions may be almost the same as the condition for forming the HIL. The HBL may include a well-known hole blocking material. Examples of the well-known hole blocking material may include an oxadiazole derivative, a triazole derivative, and a phenanthroline derivative.

The thickness of the HBL may be in the range of about 50 Å to about 1,000 Å, for example, in the range of about 100 Å to about 300 Å. When the thickness of the HBL is within this range, excellent hole blocking properties may be obtained without a substantial increase in driving voltage.

Next, the ETL may be formed using various methods such as vacuum deposition, spin coating, or casting. When the ETL is formed by vacuum deposition or spin coating, the deposition and coating conditions vary according to a used compound. However, in general, the condition may be almost the same as the condition for forming the HIL.

A material for forming the ETL may be at least one of the carborane compound of Formula 1 and a known electron transporting material. Examples of the known electron transporting material may include, but are not limited to, a quinoline derivative such as tris(8-quinolinolate)aluminum (Alq₃), 2,9-dimethyl-4,7-diphenyl-1,10-phenanthroline (BCP), 4,7-diphenyl-1,10-phenanthroline (Bphen), 3-(4-Biphenylyl)-4-phenyl-5-tert-butylphenyl-1,2,4-triazole (TAZ),4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), BAlq (refer to Formula below), and beryllium bis(benzoquinolin-10-olate) (Bebq₂).

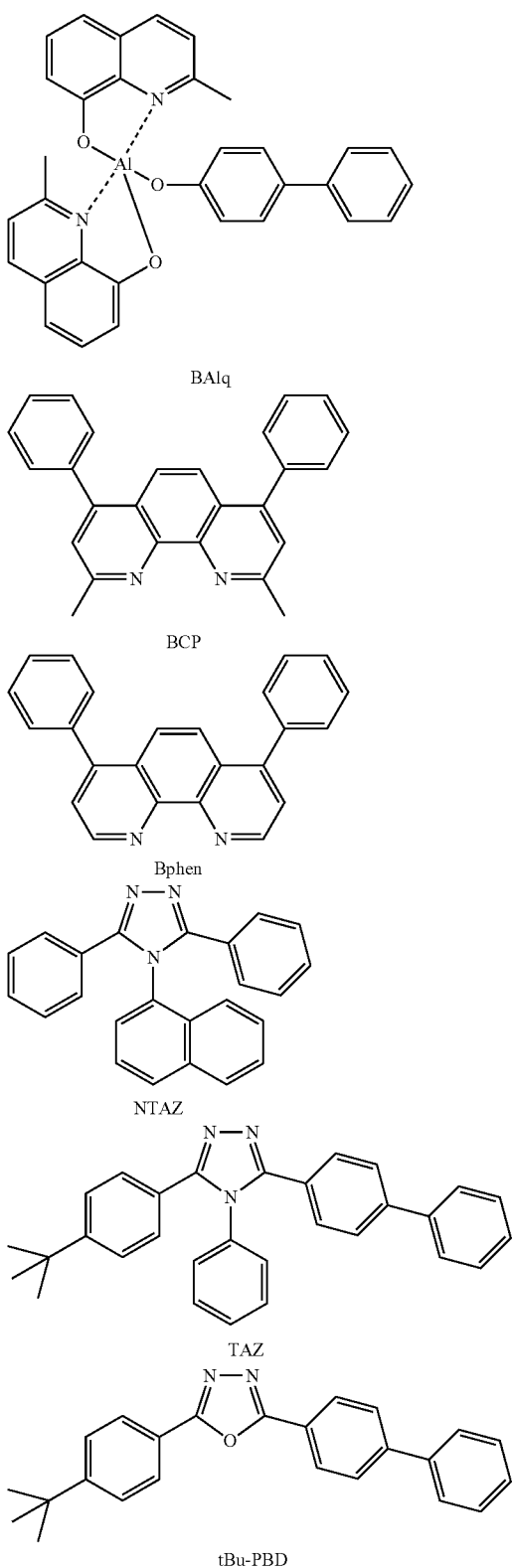

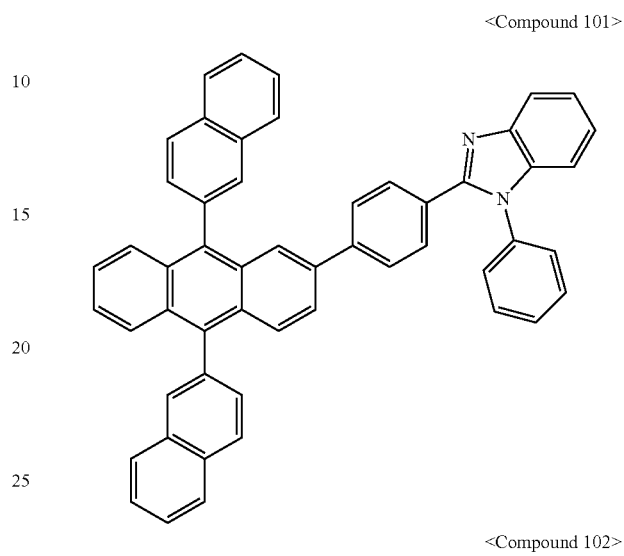

The ETL may include an electron transporting organic compound and a metal-containing material. Examples of the electron transporting organic compound include, but are not limited to, 9,10-di(naphthalene-2-yl)anthracene (ADN) and anthracene-based compounds such as Compounds 101 and 102 below:

<Compound 101>

<Compound 102>

The metal-containing material may include a Li complex. Examples of the Li complex include lithium quinolate (LiQ) and Compound 103 below:

<Compound 103>

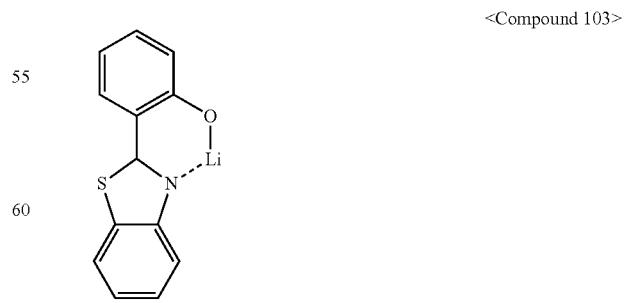

The thickness of the ETL may be in the range of about 100 Å to about 1,000 Å, for example, in the range of about 150 Å to about 500 Å. When the thickness of the ETL is within this range, satisfactory electron transport properties may be obtained without a substantial increase in driving voltage.

Also, the EIL, which facilitates electron injection from a cathode, may be formed on the ETL, and a material for forming the EIL is not particularly limited.

The material for forming the EIL may include a well-known material for forming an EIL, such as LiF, NaCl, CsF, $Li_2O$, or BaO. The deposition condition of the EIL may vary according a used compound. However, in general, the condition may be almost the same as the condition for forming the HIL.

The thickness of the EIL may be in the range of about 1 Å to about 100 Å, for example, in the range of about 3 Å to about 90 Å. When the thickness of the EIL is within this range, satisfactory electron injection properties may be obtained without a substantial increase in driving voltage.

The second electrode 17 is formed on the organic layer 15. The second electrode 17 may be a cathode, which is an electron injection electrode. Here, a metal for forming the second electrode 17 may include a metal having low work function, such as metal, an alloy, an electric conducting compound, and a mixture thereof. In particular, the second electrode 17 may be formed as a thin film by using lithium (Li), magnesium (Mg), aluminum (Al), aluminum-lithium (Al—Li), calcium (Ca), magnesium-indium (Mg—In), or magnesium-silver (Mg—Ag), thus being transparent. In order to obtain a top-emission type organic light-emitting diode, the second electrode 17 may be formed as a transparent electrode by using ITO or IZO.

In the organic light-emitting diode, when the first layer is a HIL, a HTL, or a functional layer having a hole injection ability and a hole transporting ability, the first layer may further include the charge-generating material as described above, in addition to the carborane compound of Formula 1. Also, when the first layer is an EML, the first layer may further include the phosphorescent dopant as described above, in addition to the carborane compound of Formula 1.

The organic light-emitting diode may be included in a flat display device including a transistor. Thus, according to another embodiment of the present invention, there is provided a flat display device including a transistor including a source, a drain, a gate, and an active layer; and the organic light-emitting diode described above, wherein one of the source and the drain is electrically connected to a first electrode of the organic light-emitting diode. The active layer of the transistor may be an amorphous silicon layer, a crystalline silicon layer, an organic semiconductor layer, an oxide semiconductor layer, or the like.

An organic light-emitting diode according to an embodiment of the present invention will now be described in more detail with reference to the following Examples. These Examples are for illustrative purposes only and are not intended to limit the scope of the invention.

Example

Synthesis of Compound 1

4,4"-diiodo-p-terphenyl (2) was reacted with 1-butyl-4-ethynylbenzene (3) in the presence of a platinum catalyst to form a bisacetylene precursor (4). To a toluene solution (100 ml) of decaborane ($B_{10}H_{14}$, 5.0 mmol) and the bisacetylene precursor (4) (1.20 g, 2.2 mmol) was added an excess amount of $Et_2S$ (5 equiv) at room temperature. After heating to reflux, the reaction mixture was further stirred for 3 days. The solvent was removed under vacuum and MeOH (50 ml) was added. The resulting yellow solid was filtered and re-dissolved in toluene. The solution was purified by passing through an alumina column and the solvent was removed in vacuo affording Compound 1 as white solid. Recrystallization from a mixed solvent of $CH_2Cl_2$/n-hexane gave 0.698 g of 4,4-bis[2-(p-n-butylphenyl)-1-o-carboran-1-yl]-p-terphenyl (1) as Compound 1 (40.6%).

The obtained Compound 1 was confirmed by multinuclear NMR spectroscopy, elemental analysis and X-ray diffraction methods.

$^1$H NMR (400 MHz, $CDCl_3$): δ 7.49 (s, 4H), 7.45 (d, J=8.8, 4H), 7.33 (t, J=18.0, 8H), 6.91 (d, J=8.4, 4H), 3.30-1.50 (br, 20H, CB—BH), 2.44 (t, J=15.2, 4H), 1.46 (m, J=30.4, 4H), 1.18 (m, J=22.4, 4H), 0.80 (t, J=14.8, 6H). $^{13}$C NMR (100 MHz, $CDCl_3$): δ 145.30, 141.72, 138.91, 131.10, 130.53, 130.08, 128.29, 127.99, 127.36, 126.48, 85.68 (CB—C), 84.88 (CB—C), 34.92, 32.90, 22.08, 13.80.

$^{11}$B NMR ($CDCl_3$): δ −2.6 (br s, 4B), −10.3 (br s, 16B). Anal. Calcd for $C_{42}H_{58}B_{20}$: C, 64.75; H, 7.50. Found: C, 64.61H, 7.90.

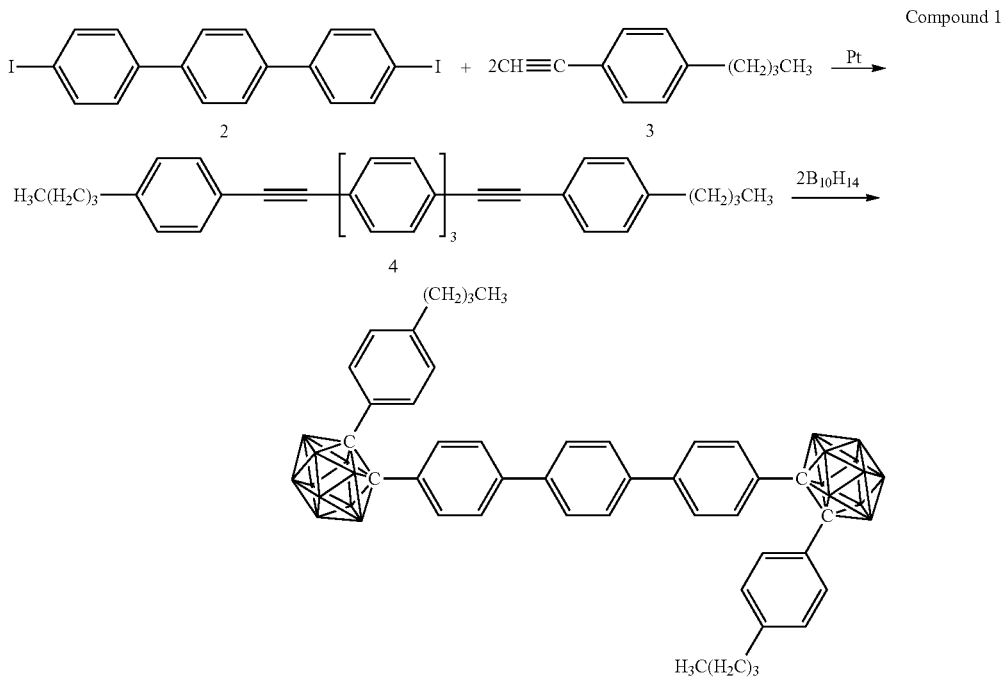

Compound 1

Comparative Example

A compound used in Comparative Example was p-terphenyl.

Evaluation Example

Ultraviolet/visible (UV/VIS) absorption spectrum and photoluminescence (PL) spectrum of each of the compounds of Example and Comparative Example were respectively measured using Jasco V-530 and a Spex Fluorog-3 luminescence spectrometer. The PL spectra thereof were measured using a degassed tetrahydrofuran (THF) solution in which each of $5.0 \times 10^{-5}$ M of Compound 1 and $1.0 \times 10^{-5}$ M of p-terphenyl is dissolved. Low-temperature PL measurement was performed using a quartz tube placed in a quartz wall Dewar flask filled with liquid nitrogen (77K). A film was formed by spin casting a THF solution of poly(methyl methacrylate) (PMMA) containing 10 wt % of Compound 1. The emission lifetime of a powder sample of Compound 1 was measured at room temperature by using a time-correlated single photon coefficient (TCSPC) spectrometer (FLS920, EDINBURGH instruments) equipped with an excitation light source of a Xe microsecond flash lamp and a micro-channel plate photomultiplier tube (MCP-PMT, 200-900 nm). Emission lifetime($\tau$) of p-terphenyl was measured using a TCSPC system equipped with mode locked Ti:sapphire pulse laser (~200 fs) as an excitation source.

Figure 2:
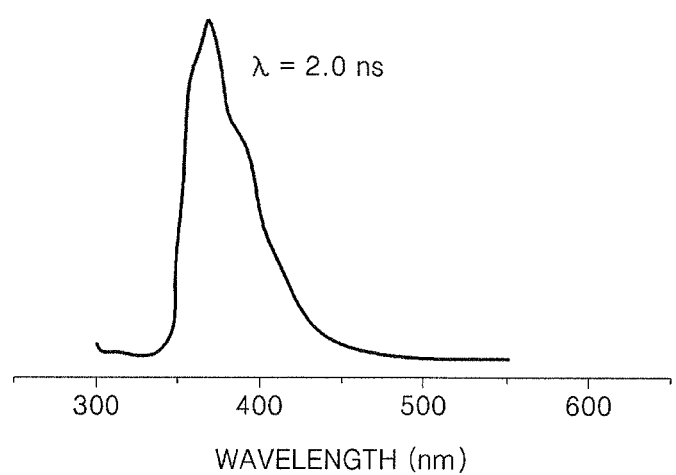
FIG. 2 is a graph showing photoluminescence spectrum of p-terphenyl.
Figure 3:
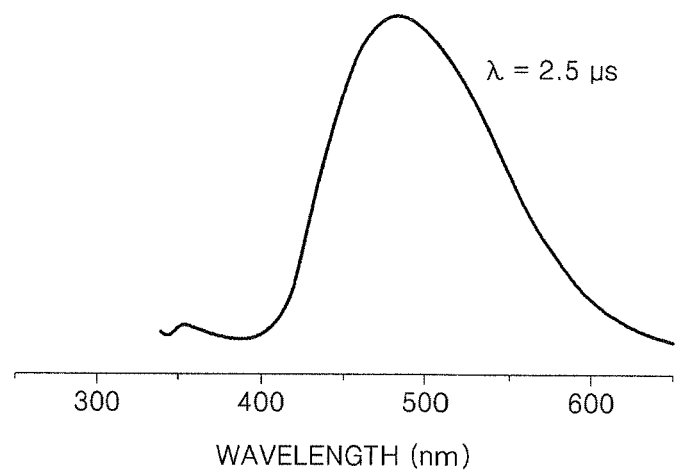
FIG. 3 is a graph showing photoluminescence spectrum of a carborane compound (Compound 1) prepared according to Example.

FIG. 2 is a graph showing photoluminescence spectrum of p-terphenyl of Comparative Example, and FIG. 3 is a graph showing photoluminescence spectrum of a carborane compound (Compound 1) prepared according to Example. The spectra of the compounds of Example and Comparative Example were measured at room temperature, and each compound was in a solid form. Referring to FIGS. 2 and 3, the PL spectrum of p-terphenyl has a peak at about 370 nm, while the PL spectrum of the carborane compound (Compound 1) of Example has a peak at about 480 nm. In other words, as carborane was linked to p-terphenyl, the PL spectrum was red-shifted, and the emission lifetime ($\tau$) of Compound 1 increased from 2 ns to 2.5 µs. This is considered that the luminescence mechanism of Compound 1 of Example involves phosphorescence luminescence of $T_1 \rightarrow S_0$ having a lower energy than fluorescence luminescence of $S_1 \rightarrow S_0$ of p-terphenyl, and thus Compound 1 of Example has an increased luminescence wavelength, resulting in an increase in emission lifetime thereof due to the phosphorescence luminescence.

Figure 4A:
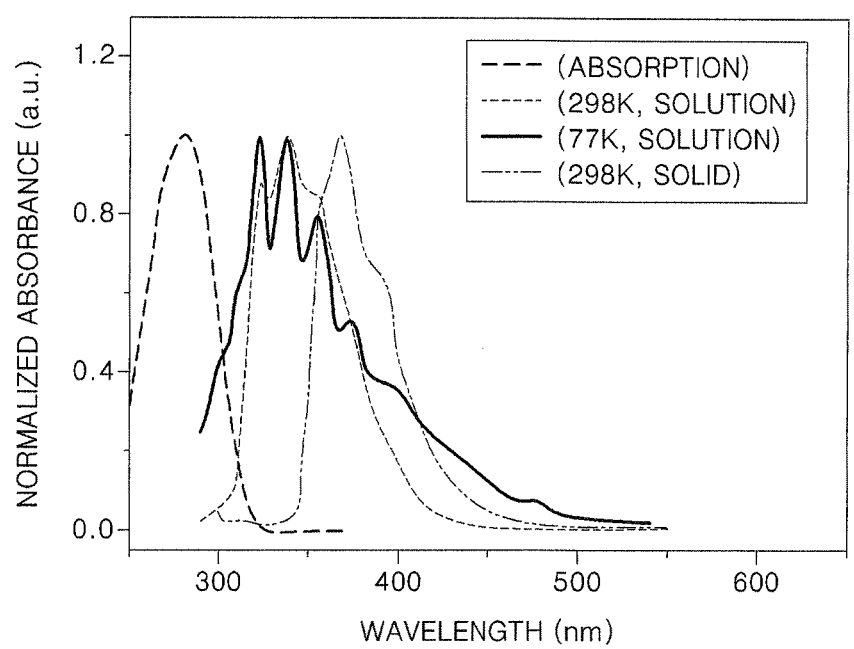
FIG. 4A is a graph showing emission spectrum spectrum of p-terphenyl according to temperature and shape.
Figure 4B:
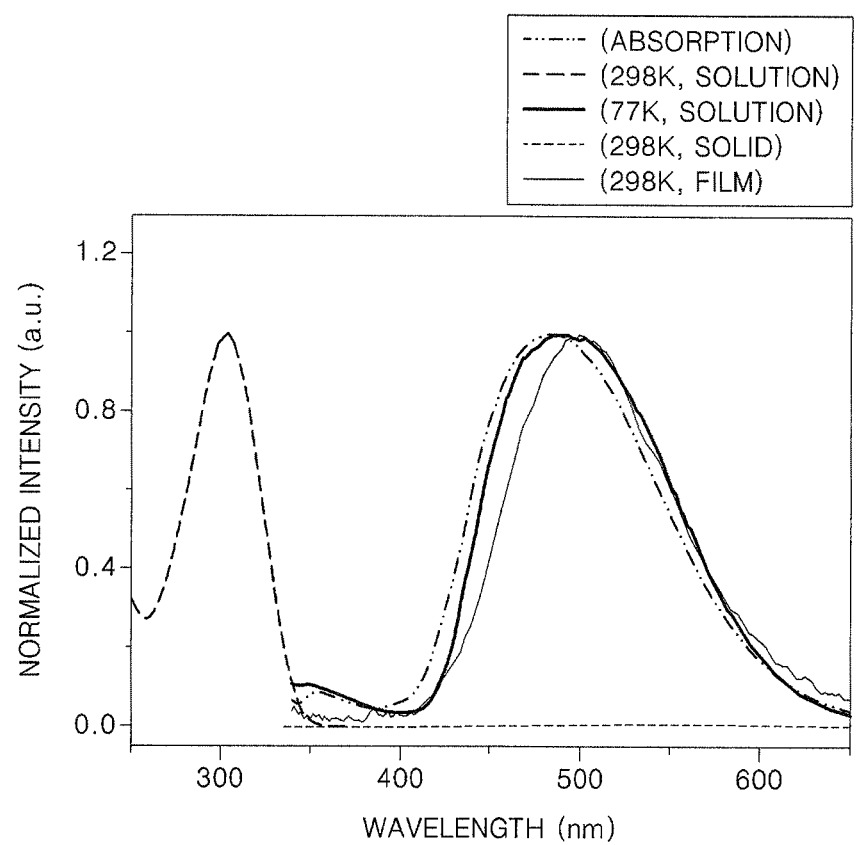
FIG. 4B is a graph showing emission spectrum of the carborane compound (Compound 1) of Example according to temperature and shape.

FIG. 4A is a graph showing emission spectrum spectrum of p-terphenyl of Comparative Example according to temperature and shape, and FIG. 4B is a graph showing emission spectrum of the carborane compound of Example (Compound 1) according to temperature and shape.

Referring to FIGS. 4A and 4B, an absorption spectrum of p-terphenyl appears at about 270 nm, and an absorption spectrum of Compound 1 of Example appears at about 304 nm. While p-terphenyl in a solution state at room temperature exhibits strong fluorescence luminescence at about 340 nm, the carborane compound (Compound 1) of Example does not emit light in a solution state at room temperature and exhibits strong blue-green luminescence at about 480 nm in a solution state at 77K. Notably, the carborane compound of Example in a solid state at room temperature exhibits an emission band that is almost the same as that in a solution state at 77K. From the fact that as well as a large Stoke's shift (about 180 nm), the emission lifetime of Compound 1 of Example in a solid state is about 2.5 µs, it is confirmed that Compound 1 of Example emits phosphorescence. In addition, a luminescence spectrum of a PMMA film doped with 10 wt % of Compound 1 of Example has luminous properties similar to that of Compound 1 of Example, i.e., red-shifted a bit.

In contrast, the PL spectrum of p-terphenyl at 77 K exhibits strong fluorescence luminescence at the same position as that measured in a solid state at room temperature, and has a weak phosphorescence shoulder in a low energy region. Also, p-terphenyl in a solid state at room temperature exhibits similar fluorescence properties including overall red-shift.

Figure 5A:
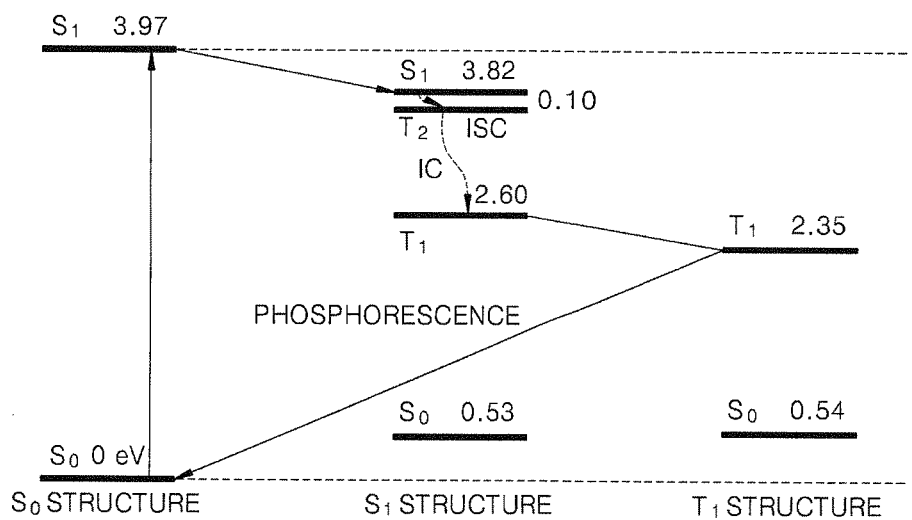
FIG. 5A illustrates an energy level of geometric structures $S_0$, $S_1$ and $T_1$ of p-terphenyl prepared according to Comparative Example, calculated using TD-DFT.
Figure 5B:
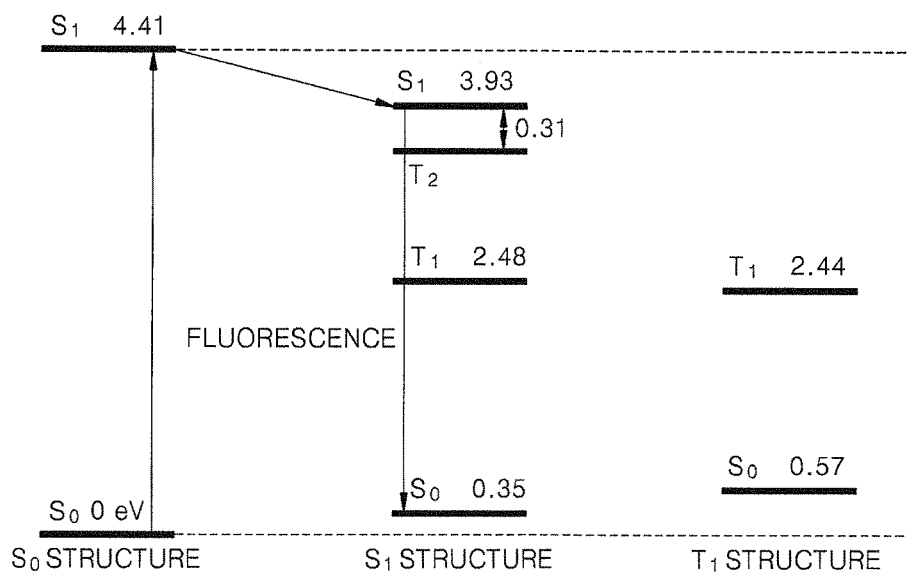
FIG. 5B illustrates an energy level of geometric structures $S_0$, $S_1$ and $T_1$ of the carborane compound (Compound 1) of Example, calculated using TD-DFT.

FIG. 5A is a diagram illustrating an energy level of geometric structures $S_0$, $S_1$ and $T_1$ of p-terphenyl of Comparative Example, calculated using TD-DFT, and FIG. 5B is a diagram illustrating an energy level of geometric structures $S_0$, $S_1$ and $T_1$ of the carborane compound of Example (Compound 1), calculated using TD-DFT. The geometric structures $S_0$, $S_1$, and $T_1$ respectively indicate geometric structures of molecules measured from an absorption spectrum, a fluorescence emission spectrum, and a phosphorescence emission spectrum. In both p-terphenyl of Comparative Example and the carborane compound of Example, as the geometric structures go from $S_0$ to $S_1$ to $T_1$, angles between phenyl groups in the p-terphenyl group become smaller, and thus the phenyl groups in the $T_1$ structure lie substantially on a plane.

Referring to FIGS. 5A and 5B, in optimal $S_1$ and $T_1$ structures of Compound 1 of Example and p-terphenyl of Comparative Example, an energy of Compound 1 of Example in the $S_1$ state is lower than an energy of p-terphenyl of Comparative Example in the $S_1$ state, and an energy of Compound 1 of Example in the $T_1$ and $T_2$ states is higher than an energy of p-terphenyl in the $T_1$ and $T_2$ states. Thus, a gap between the energies of Compound 1 of Example in the $S_1$ state and the $T_2$ state most adjacent to the $S_1$ state is much smaller than that of p-terphenyl. This enables the $S_1$ state of Compound 1 of Example to be easily transferred to the $T_2$ state.

As described above, Compound 1 of Example in a solution state does not emit light. This is considered because the energy of the $S_1$ state is lost to other states including the $T_2$ state, through non-radioactive attenuation due to free rotation of carborane and p-terphenyl in the solution of Compound 1 of Example. In addition, it is attributed to a difference in solution-state and solid-state structures of Compound 1 of Example. In other words, this is because strong phosphorescence of Compound 1 of Example comes from the $T_1$ state, and such a $T_1$ state requiring substantially planar and solid conformation cannot be stably maintained due to free rotation of carborane and the p-terphenyl group, in spite of rapid intersystem crossing from the $S_1$ state to the $T_2$ state in the solution state of Compound 1 of Example.

Substitution of p-terphenyl with carborane enables a small energy gap between the $S_1$ state (excited state) and the $T_2$ state most adjacent thereto, thereby accelerating the intersystem crossing from $S_1$ to $T_2$, which finally make the carborane compound in the $T_1$ state. As a result, the carborane compound emits strong phosphorescence at room temperature.

As described above, according to the one or more embodiments of the present invention, a carborane compound represented by Formula 1 above has a high possibility of intersystem crossing at room temperature, and thus an efficiency of generating excitons is high, resulting in high luminous efficiency. Thus, an organic light-emitting diode including the carborane compound of Formula 1 may have excellent luminous efficiency at room temperature, and a high-quality flat display device including the organic light-emitting diode may be provided.

While the present invention has been particularly shown and described with reference to exemplary embodiments

What is claimed is:

1. An organic light-emitting diode comprising:
a first electrode;
a second electrode facing the first electrode; and
an emission layer interposed between the first electrode and the second electrode;
wherein
the emission layer comprises a host and a dopant comprised of a compound represented by Formula 1 below:

$(R_1)_a$—CB-[Ar]$_n$—CB—$(R_2)_b$  <Formula 1> wherein CB refers to carborane,
each of $R_1$ and $R_2$ is independently one selected from the group consisting of a hydrogen atom, a deuterium atom, a halogen atom, a hydroxyl group, a cyano group, a nitro group, a nitrile group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{30}$ aryl group, a substituted or unsubstituted $C_2$-$C_{30}$ heteroaryl group, a substituted or unsubstituted $C_5$-$C_{30}$ aryloxy group, a substituted or unsubstituted $C_1$-$C_{30}$ acyl group, a substituted or unsubstituted $C_1$-$C_{30}$ amide group, a substituted or unsubstituted $C_2$-$C_{30}$ ester group, a substituted or unsubstituted $C_5$-$C_{30}$ arylthio group, and a group represented by $N(Q_1)(Q_2)$, and each of $Q_1$ and $Q_2$ is independently one selected from the group consisting of a hydrogen atom, a deuterium atom, a halogen atom, a hydroxyl group, a cyano group, an amino group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted pyridinyl group, a substituted or unsubstituted naphthyl group, a substituted or unsubstituted anthryl group, a substituted or unsubstituted fluorenyl group, a substituted or unsubstituted carbazolyl group, and a substituted or unsubstituted pyrimidinyl group,
each of a and b is independently an integer of 1 to 10, a $R_1$ groups are the same as or different from each other and b $R_2$ groups are the same as or different from each other,
Ar is a substituted or unsubstituted phenylene group,
n is an integer of 1 to 10, and, when n is more than 1, the Ar groups are the same as or different from each other.

2. The organic light-emitting diode of claim 1, wherein the carborane is represented by $C_2B_{10}H_{10}$.

3. The organic light-emitting diode of claim 1, wherein the carborane is represented by $C_1B_{11}H_{10}$.

4. The organic light-emitting diode of claim 1, wherein the carborane is an ortho-, meta- or para-carborane.

5. The organic light-emitting diode of claim 1, wherein —[Ar]$_n$— is bonded to a carbon atom of one of the carboranes and a carbon atom of the other of the carboranes.

6. The organic light-emitting diode of claim 1, wherein —[Ar]$_n$— is bonded to a boron atom of one of the carboranes and to a boron atom of the other of the carboranes.

7. The organic light-emitting diode of claim 1, wherein [Ar] is represented by Formula 2 below:

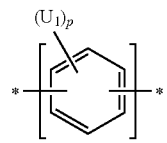

<Formula 2> wherein $U_1$ is one selected from the group consisting of a hydrogen atom, a deuterium atom, a halogen atom, a hydroxyl group, a cyano group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted biphenyl group, a substituted or unsubstituted terphenyl group, a substituted or unsubstituted phenoxy group, a substituted or unsubstituted fluorenyl group, a substituted or unsubstituted carbazolyl group, a substituted or unsubstituted naphthyl group, a substituted or unsubstituted phenanthrenyl group, a substituted or unsubstituted pyridinyl group, a substituted or unsubstituted diazinyl group, a substituted or unsubstituted triazynyl group, a substituted or unsubstituted quinolinyl group, a substituted or unsubstituted benzimidazolyl group, a substituted or unsubstituted benzooxazolyl group, a substituted or unsubstituted pentalenyl group, a substituted or unsubstituted indenyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted spiro-fluorenyl group, a substituted or unsubstituted phenalenyl group, a substituted or unsubstituted phenanthridinyl group, a substituted or unsubstituted phenanthrolinyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted imidazopyridinyl group, a substituted or unsubstituted pyrazinyl group, a substituted or unsubstituted pyrimidinyl gruop, a substituted or unsubstituted imidazopyrimidinyl group, a substituted or unsubstituted pyridazinyl group, a substituted or unsubstituted indolyl group, a substituted or unsubstituted isoindolyl group, a substituted or unsubstituted pyridoindolyl group, a substituted or unsubstituted indazolyl group, a substituted or unsubstituted purinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted phenazinyl group, a substituted or unsubstituted furanyl group, a substituted or unsubstituted benzofuranyl group, a substituted or unsubstituted dibenzofuranyl group, a substituted or unsubstituted thiophenyl group, a substituted or unsubstituted benzothiophenyl group, a substituted or unsubstituted dibenzothiophenyl group, a substituted or unsubstituted thiazolyl group, a substituted or unsubstituted isothiazolyl group, a substituted or unsubstituted benzothiazolyl group, a substituted or unsubstituted oxazolyl group, a substituted or unsubstituted isoxazolyl group, a substituted or unsubstituted oxadiazolyl group, a substituted or unsubstituted triazolyl group, a substituted or unsubstituted tetrazolyl group, and a group represented by $N(Q_1)(Q_2)$, and each of $Q_1$ and $Q_2$ is independently one selected from the group consisting of a hydrogen atom, a deuterium atom, a halogen atom, a hydroxyl group, a cyano group, an amino group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted pyridinyl group, a substituted or unsubstituted naphthyl group, a substituted or unsubstituted anthryl group, a substituted or unsubstituted fluorenyl group, a substituted or unsubstituted carbazolyl group, and a substituted or unsubstituted pyrimidinyl group, p is an integer of 1 to 4, and when p is equl or larger than 2, the $U_1$ groups are the same as or different from each other.

8. The organic light-emitting diode of claim 1, wherein —[Ar]$_n$— is represented by Formula 3a, 3b or 3c below:

<Formula 3a>

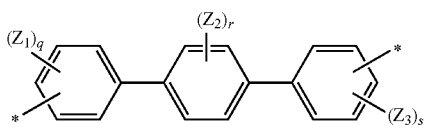

<Formula 3b>

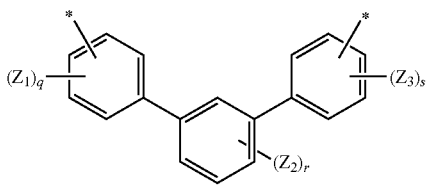

<Formula 3c>

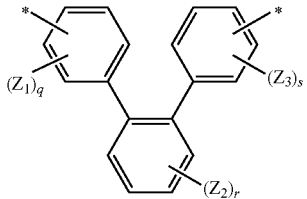

wherein each of $Z_1$, $Z_2$ and $Z_3$ is independently one selected from the group consisting of a hydrogen atom, a deuterium atom, a halogen atom, a hydroxyl group, a cyano group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted biphenyl group, a substituted or unsubstituted terphenyl group, a substituted or unsubstituted phenoxy group, a substituted or unsubstituted fluorenyl group, a substituted or unsubstituted carbazolyl group, a substituted or unsubstituted naphthyl group, a substituted or unsubstituted phenanthrenyl group, a substituted or unsubstituted pyridinyl group, a substituted or unsubstituted diazinyl group, a substituted or unsubstituted triazynyl group, a substituted or unsubstituted quinolinyl group, a substituted or unsubstituted benzimidazolyl group, a substituted or unsubstituted benzooxazolyl group, a substituted or unsubstituted pentalenyl group, a substituted or unsubstituted indenyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted spiro-fluorenyl group, a substituted or unsubstituted phenalenyl group, a substituted or unsubstituted phenanthridinyl group, a substituted or unsubstituted phenanthrolinyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted imidazopyridinyl group, a substituted or unsubstituted pyrazinyl group, a substituted or unsubstituted pyrimidinyl gruop, a substituted or unsubstituted imidazopyrimidinyl group, a substituted or unsubstituted pyridazinyl group, a substituted or unsubstituted indolyl group, a substituted or unsubstituted isoindolyl group, a substituted or unsubstituted pyridoindolyl group, a substituted or unsubstituted indazolyl group, a substituted or unsubstituted purinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted phenazinyl group, a substituted or unsubstituted furanyl group, a substituted or unsubstituted benzofuranyl group, a substituted or unsubstituted dibenzofuranyl group, a substituted or unsubstituted thiophenyl group, a substituted or unsubstituted benzothiophenyl group, a substituted or unsubstituted dibenzothiophenyl group, a substituted or unsubstituted thiazolyl group, a substituted or unsubstituted isothiazolyl group, a substituted or unsubstituted benzothiazolyl group, a substituted or unsubstituted oxazolyl group, a substituted or unsubstituted isoxazolyl group, a substituted or unsubstituted oxadiazolyl group, a substituted or unsubstituted triazolyl group, a substituted or unsubstituted tetrazolyl group, and of a group represented by $N(Q_1)(Q_2)$, and each of $Q_1$ and $Q_2$ is independently one selected from the group consisting of a hydrogen atom, a deuterium atom, a halogen atom, a hydroxy group, a cyano group, an amino group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted pyridinyl group, a substituted or unsubstituted naphthyl group, a substituted or unsubstituted anthryl group, a substituted or unsubstituted fluorenyl group, a substituted or unsubstituted carbazolyl group, and a substituted or unsubstituted pyrimidinyl group, a plurality of $Z_1$, $Z_2$ and $Z_3$ are each independently the same as or different from each other;

each of q, r and s is an integer of 0 to 4, and

* denotes a binding site.

9. The organic light-emitting diode of claim 1, wherein the compound represented by Formula 1 is represented by one of Formulae 4a through 4c below:

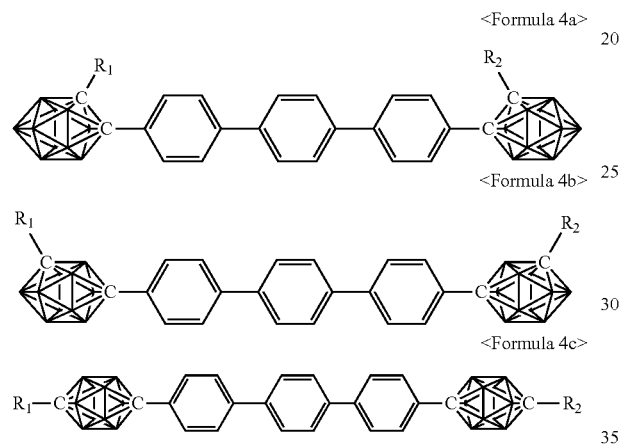

<Formula 4a>

<Formula 4b>

<Formula 4c> wherein vertexes at which element symbols are not represented each independently indicate B-H; and each of $R_1$ and $R_2$ is independently one selected from the group consisting of a hydrogen atom, a deuterium atom, a halogen atom, a hydroxyl group, a cyano group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted biphenyl group, a substituted or unsubstituted terphenyl group, a substituted or unsubstituted phenoxy group, a substituted or unsubstituted fluorenyl group, a substituted or unsubstituted carbazolyl group, a substituted or unsubstituted naphthyl group, a substituted or unsubstituted phenanthrenyl group, a substituted or unsubstituted pyridinyl group, a substituted or unsubstituted diazinyl group, a substituted or unsubstituted triazynyl group, a substituted or unsubstituted quinolinyl group, a substituted or unsubstituted benzimidazolyl group, a substituted or unsubstituted benzooxazolyl group, a substituted or unsubstituted pentalenyl group, a substituted or unsubstituted indenyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted spiro-fluorenyl group, a substituted or unsubstituted phenalenyl group, a substituted or unsubstituted phenanthridinyl group, a substituted or unsubstituted phenanthrolinyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted imidazopyridinyl group, a substituted or unsubstituted pyrazinyl group, a substituted or unsubstituted pyrimidinyl gruop, a substituted or unsubstituted imidazopyrimidinyl group, a substituted or unsubstituted pyridazinyl group, a substituted or unsubstituted indolyl group, a substituted or unsubstituted isoindolyl group, a substituted or unsubstituted pyridoindolyl group, a substituted or unsubstituted indazolyl group, a substituted or unsubstituted purinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted phenazinyl group, a substituted or unsubstituted furanyl group, a substituted or unsubstituted benzofuranyl group, a substituted or unsubstituted dibenzofuranyl group, a substituted or unsubstituted thiophenyl group, a substituted or unsubstituted benzothiophenyl group, a substituted or unsubstituted dibenzothiophenyl group, a substituted or unsubstituted thiazolyl group, a substituted or unsubstituted isothiazolyl group, a substituted or unsubstituted benzothiazolyl group, a substituted or unsubstituted oxazolyl group, a substituted or unsubstituted isoxazolyl group, a substituted or unsubstituted oxadiazolyl group, a substituted or unsubstituted triazolyl group, a substituted or unsubstituted tetrazolyl group, and a group represented by $N(Q_1)(Q_2)$, and each of $Q_1$ and $Q_2$ is independently one selected from the group consisting of a hydrogen atom, a deuterium atom, a halogen atom, a hydroxyl group, a cyano group, an amino group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted pyridinyl group, a substituted or unsubstituted naphthyl group, a substituted or unsubstituted anthryl group, a substituted or unsubstituted fluorenyl group, a substituted or unsubstituted carbazolyl group, and a substituted or unsubstituted pyrimidinyl group.

10. The organic light-emitting diode of claim 1, wherein the compound represented by Formula 1 emits phosphorescence from a triplet state $T_1$.

11. The organic light-emitting diode of claim 1, wherein an energy gap between a singlet state $S_1$ and a triplet state $T_2$ of the compound represented by Formula 1 is between about 0.05 eV to about 0.15 eV.

12. The organic light-emitting diode of claim 1, wherein the compound represented by Formula 1 has a phosphorescence lifetime in the range of about 0.1 µs to about 50 µs.

13. The organic light-emitting diode of claim 1, further comprising, between the first electrode and the second electrode, at least one selected from the group consisting of a hole injection layer, a hole transport layer, a functional layer having a hole injection ability and a hole transporting ability, an electron blocking layer, a hole blocking layer, an electron transport layer, and an electron injection layer, and a functional layer having an electron injection ability and an electron transporting ability.

14. The organic light-emitting diode of claim 13, wherein at least one of the hole injection layer, the hole transport layer, and the functional layer having a hole injection ability and a hole transporting ability further comprises a charge-generating material.

15. The organic light-emitting diode of claim 1, wherein the emission layer further comprises a a fluorescent or phosphorescent dopant.

16. The organic light-emitting diode of claim 15, wherein the phosphorescent dopant comprises an organometallic complex comprising iridium (Ir), platinum (Pt), osmium (Os), rhenium (Re), titanium (Ti), zirconium (Zr), and hafnium (Hf) or a combination of at least two of these elements.

17. The organic light-emitting diode of claim 13, wherein the electron transport layer comprises an electron transporting organic material and a metal-containing material.

18. The organic light-emitting diode of claim 17, wherein the metal-containing material is a Li complex.

19. A flat display device comprising a transistor comprising a source, a drain, a gate, and an active layer; and the organic light-emitting diode according to claim 1, wherein one of the source and the drain is electrically connected to a first electrode of the organic light-emitting diode.

20. The organic light-emitting diode of claim 1, wherein each of $R_1$ and $R_2$ is independently one selected from the group consisting of a hydrogen atom, a deuterium atom, a halogen atom, a hydroxyl group, a cyano group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted biphenyl group, a substituted or unsubstituted terphenyl group, a substituted or unsubstituted phenoxy group, a substituted or unsubstituted fluorenyl group, a substituted or unsubstituted carbazolyl group, a substituted or unsubstituted naphthyl group, a substituted or unsubstituted phenanthrenyl group, a substituted or unsubstituted pyridinyl group, a substituted or unsubstituted diazinyl group, a substituted or unsubstituted triazinyl group, a substituted or unsubstituted quinolinyl group, a substituted or unsubstituted benzimidazolyl group, a substituted or unsubstituted benzoxazolyl group, a substituted or unsubstituted pentalenyl group, a substituted or unsubstituted indenyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted spiro-fluorenyl group, a substituted or unsubstituted phenalenyl group, a substituted or unsubstituted phenanthridinyl group, a substituted or unsubstituted phenanthrolinyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted imidazopyridinyl group, a substituted or unsubstituted pyrazinyl group, a substituted or unsubstituted pyrimidinyl group, a substituted or unsubstituted imidazopyrimidinyl group, a substituted or unsubstituted pyridazinyl group, a substituted or unsubstituted indolyl group, a substituted or unsubstituted isoindolyl group, a substituted or unsubstituted pyridoindolyl group, a substituted or unsubstituted indazolyl group, a substituted or unsubstituted purinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted phenazinyl group, a substituted or unsubstituted furanyl group, a substituted or unsubstituted benzofuranyl group, a substituted or unsubstituted dibenzofuranyl group, a substituted or unsubstituted thiophenyl group, a substituted or unsubstituted benzothiophenyl group, a substituted or unsubstituted dibenzothiophenyl group, a substituted or unsubstituted thiazolyl group, a substituted or unsubstituted isothiazolyl group, a substituted or unsubstituted benzothiazolyl group, a substituted or unsubstituted oxazolyl group, a substituted or unsubstituted isoxazolyl group, a substituted or unsubstituted oxadiazolyl group, a substituted or unsubstituted triazolyl group, a substituted or unsubstituted tetrazolyl group, and a group represented by $N(Q_1)(Q_2)$, and each of $Q_1$ and $Q_2$ is independently one selected from the group consisting of a hydrogen atom, a deuterium atom, a halogen atom, a hydroxyl group, a cyano group, an amino group, a nitro group, a carboxyl group, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted phenyl group, a substituted or unsubstituted pyridinyl group, a substituted or unsubstituted naphthyl group, a substituted or unsubstituted anthryl group, a substituted or unsubstituted fluorenyl group, a substituted or unsubstituted carbazolyl group, and a substituted or unsubstituted pyrimidinyl group.

\* \* \* \* \*